US012769041B2

(12) United States Patent
Ohmuro et al.

(10) Patent No.: US 12,769,041 B2
(45) Date of Patent: Oct. 20, 2026

(54) OPTICAL LAMINATE AND IMAGE DISPLAY DEVICE

(71) Applicant: FUJIFILM Corporation, Tokyo (JP)

(72) Inventors: Katsufumi Ohmuro, Kanagawa (JP); Daiki Wakizaka, Kanagawa (JP); Naoki Koito, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 355 days.

(21) Appl. No.: 18/349,649

(22) Filed: Jul. 10, 2023

(65) Prior Publication Data

US 2023/0350118 A1 Nov. 2, 2023

Related U.S. Application Data

(63) Continuation of application No. PCT/JP2022/001758, filed on Jan. 19, 2022.

(30) Foreign Application Priority Data

Jan. 19, 2021 (JP) ................................ 2021-006428
Jul. 7, 2021 (JP) ................................ 2021-112542

(51) Int. Cl.
*G02B 5/30* (2006.01)
*H10K 59/80* (2023.01)

(52) U.S. Cl.
CPC ....... *G02B 5/3016* (2013.01); *H10K 59/8722* (2023.02)

(58) Field of Classification Search
CPC ...... G02B 5/3016; G02B 5/30; G02B 5/3083; H10K 59/8722; B32B 7/023; B32B 27/00; C09J 7/24; C09J 7/29; C09J 7/38; C09J 201/00; G02F 1/1335; G02F 1/13363; G09F 9/00; H05B 33/02
See application file for complete search history.

(56) References Cited

U.S. PATENT DOCUMENTS

2005/0272898 A1* 12/2005 Sasano .................. C09J 175/06 428/423.1
2010/0297368 A1* 11/2010 Park ......................... C07F 9/58 525/218
2018/0356679 A1* 12/2018 Iida ...................... G02F 1/1335
(Continued)

FOREIGN PATENT DOCUMENTS

JP 2004-361712 A 12/2004
JP 2005-294539 A 10/2005
(Continued)

OTHER PUBLICATIONS

International Search Report issued in PCT/JP2022/001758 on Mar. 22, 2022.
(Continued)

*Primary Examiner* — Mariam Qureshi
(74) *Attorney, Agent, or Firm* — Edwards Neils LLC; Jean C. Edwards, Esq.

(57) ABSTRACT

Provided is an optical laminate with excellent durability and an image display device formed of the optical laminate. The optical laminate includes a polarizer, a retardation layer including a cycloolefin-based polymer film, and a pressure sensitive adhesive layer in this order, in which the polarizer includes a protective layer on at least one side, and specific conditions are satisfied.

16 Claims, 3 Drawing Sheets

(56) References Cited

U.S. PATENT DOCUMENTS

| | | | | |
|---|---|---|---|---|
| 2019/0004225 A1* | 1/2019 | Iijima | B32B 27/08 | |
| 2023/0119700 A1* | 4/2023 | Nakanishi | C09J 133/14 | 428/412 |

FOREIGN PATENT DOCUMENTS

| | | | |
|---|---|---|---|
| JP | 2010-107953 | A | 5/2010 |
| JP | 2016-186618 | A | 10/2016 |
| JP | 2018-017891 | A | 2/2018 |
| JP | 2010-516855 | A | 5/2020 |
| WO | 2017/164004 | A1 | 9/2017 |
| WO | 2021/192423 | A1 | 9/2021 |

OTHER PUBLICATIONS

Written Opinion issued in PCT/JP2022/001758 on Mar. 22, 2022.
International Preliminary Report on Patentability completed by WIPO on Jul. 20, 2023 in connection with International Patent Application No. PCT/JP2022/001758.
Japanese Office Action issued Dec. 23, 2025, in connection with Japanese Patent Application No. 2022-576714.
Office Action, which was issued by the State Intellectual Property Office of China on May 10, 2026, in connection with Chinese Patent Application No. 202280010708.8.

* cited by examiner

OPTICAL LAMINATE AND IMAGE DISPLAY DEVICE

CROSS-REFERENCE TO RELATED APPLICATIONS

This application is a Continuation of PCT International Application No. PCT/JP2022/001758 filed on Jan. 19, 2022, which was published under PCT Article 21 (2) in Japanese, and which claims priority under 35 U.S.C. § 119(a) to Japanese Patent Application No. 2021-006428 filed on Jan. 19, 2021 and Japanese Patent Application No. 2021-112542 filed on Jul. 7, 2021. The above applications are hereby expressly incorporated by reference, in their entirety, into the present application.

BACKGROUND OF THE INVENTION

1. Field of the Invention

The present invention relates to an optical laminate and an image display device. In particular, the present invention relates to an optical laminate that includes a retardation layer including a cycloolefin-based polymer film and a pressure sensitive adhesive layer, and an image display device.

2. Description of the Related Art

An in-plane switching (IPS) type or fringe field switching (FFS) type liquid crystal display device system is not a mode in which an electric field is applied between upper and lower substrates and driven by the rise of liquid crystal molecules such as a twisted nematic (TN) type or a vertical alignment (VA) type, but a mode that is referred to as a horizontal electric field system in which liquid crystal molecules respond in a substrate in-plane direction due to the electric field containing a component substantially parallel to a substrate surface.

In addition, the IPS type or FFS type liquid crystal display device system is a system with less restrictions on the viewing angle in principle due to the structure thereof and thus is known as a driving system having characteristics in which the viewing angle is wide and the chromaticity shift and a change in color tone are small.

In these horizontal electric field system liquid crystal display devices, a configuration used without hindering the advantage of the liquid crystal cell described above by using a protective film of a polarizing plate that sandwiches cells as an isotropic film is known (for example, see JP2010-107953A).

Further, since compensation due to the polarizer has not been examined in this configuration, optical compensation particularly for a decrease in contrast and color shift due to light leakage in visual recognition in an oblique direction is known to be required. For example, WO2017/164004A or the like discloses a horizontal electric field system liquid crystal display device having a wide viewing angle, in which optical compensation is examined for the entire display device by disposing an optically anisotropic layer.

SUMMARY OF THE INVENTION

Meanwhile, in the liquid crystal display device described in WO2017/164004A or the like, a retardation layer using a cycloolefin-based polymer as a base material is known to be used for the purpose of improving a change in display performance due to a change in temperature and humidity environment of a use environment.

As a result of examination on the durability of the liquid crystal display device including such a retardation layer, the present inventors clarified that the liquid crystal display device has no problem in a case of being used for a general personal computer (PC) monitor or a television, but there is room for improvement in a case where the liquid crystal display device is use for applications such as outdoor signage, industrial use, in-vehicle use, and the like.

Therefore, an object of the present invention is to provide an optical laminate with excellent durability and an image display device formed of the optical laminate.

As a result of intensive examination conducted by the present inventors in order to achieve the above-described object, it was found that an organic low-molecular-weight component contained in a pressure sensitive adhesive layer in contact with a retardation layer containing a cycloolefin-based polymer affects the durability. Further, the present inventors found that the above-described problems can be solved by providing an interlayer between a retardation layer and a pressure sensitive adhesive layer or decreasing the content of an organic low-molecular-weight component contained in the pressure sensitive adhesive layer, thereby completing the present invention.

That is, the present inventors found that the above-described object can be achieved by employing the following configurations.

[1] An optical laminate comprising in the following order: a polarizer; a retardation layer including a cycloolefin-based polymer film; and a pressure sensitive adhesive layer, in which the polarizer includes a protective layer on at least one side, and Condition I and Condition III, or Condition II and Condition III are satisfied, Condition I: an interlayer is further provided between the retardation layer and the pressure sensitive adhesive layer, Condition II: the pressure sensitive adhesive layer contains an organic low-molecular-weight component having a molecular weight of 500 or less, and a content of the organic low-molecular-weight component having a molecular weight of 500 or less is 2.6% by mass or less, or in a case where a durability test is performed at 115° C. for 100 hours in a state in which the retardation layer and the pressure sensitive adhesive layer are in direct contact with each other and the optical laminate is adhered to a glass substrate via the pressure sensitive adhesive layer, a content of an organic low-molecular-weight component having a molecular weight of 32 to 200 in the pressure sensitive adhesive layer after the durability test is 50% or less of a content of the organic low-molecular-weight component having a molecular weight of 32 to 200 before the durability test, Condition III: an in-plane retardation Re(550) and a thickness direction retardation Rth (550) of an entire retardation layer at a wavelength of 550 nm respectively satisfy Expressions (1) and (2), $$0\ \text{nm} \leq Re(550) \leq 350\ \text{nm} \qquad \text{Expression (1):}$$

$$-200\ \text{nm} \leq Rth(550) \leq 200\ \text{nm}. \qquad \text{Expression (2):}$$

[2] The optical laminate according to [1], in which Condition I is satisfied, the retardation layer and the interlayer are in direct contact with each other, and the interlayer is an organic interlayer or an inorganic interlayer.

[3] The optical laminate according to [1], in which Condition I is satisfied, and the interlayer is a polymer film provided between the retardation layer and the pressure sensitive adhesive layer via an adhesive or a pressure sensitive adhesive having a film thickness of 0.1 to 50 μm.

[4] The optical laminate according to [3], in which the polymer film contains at least one selected from the group consisting of a cycloolefin-based polymer, an acrylic polymer, a polycarbonate-based polymer, and a cellulose-based polymer.

[5] The optical laminate according to any one of [1] to [4], in which Condition I is satisfied, and an in-plane retardation Re1 (550) and a thickness direction retardation Rth1 (550) of an entirety of the retardation layer and the interlayer at a wavelength of 550 nm respectively satisfy Expression (1) and Expression (2), $$0\ \text{nm} \le \text{Re1}(550) \le 350\ \text{nm} \quad \text{Expression (1):}$$

$$-200\ \text{nm} \le \text{Rth1}(550) \le 200\ \text{nm}. \quad \text{Expression (2):}$$

[6] The optical lamination according to any one of [1] to [5], in which in a measurement performed on the pressure sensitive adhesive layer using a headspace type gas chromatograph mass spectrometer, the content of the organic low-molecular-weight component having a molecular weight of 32 to 200 is 1,000 ppm or less.

[7] The optical lamination according to any one of [1] to [6], in which in a case where the durability test is performed at 115° C. for 100 hours in the state in which the optical laminate is adhered to the glass substrate via the pressure sensitive adhesive layer, in a measurement performed on the pressure sensitive adhesive layer after the durability test using a headspace type gas chromatograph mass spectrometer, the content of the organic low-molecular-weight component having a molecular weight of 32 to 200 is 500 ppm or less.

[8] The optical laminate according to any one of [1] to [7], in which a film thickness of the pressure sensitive adhesive layer is 5 μm or greater and 50 μm or less, and a storage elastic modulus of the pressure sensitive adhesive layer is 0.18 MPa or greater and 5 MPa or less.

[9] The optical laminate according to any one of [1] to [8], in which a residual amount of an acrylic acid ester-based or methacrylic acid ester-based monomer having a cyclic structure in the pressure sensitive adhesive layer is 100 ppm or less.

[10] An image display device comprising: the optical laminate according to any one of [1] to [9].

According to the present invention, it is possible to provide an optical laminate with excellent durability and an image display device formed of the optical laminate.

DESCRIPTION OF THE PREFERRED EMBODIMENTS

Figure 1:
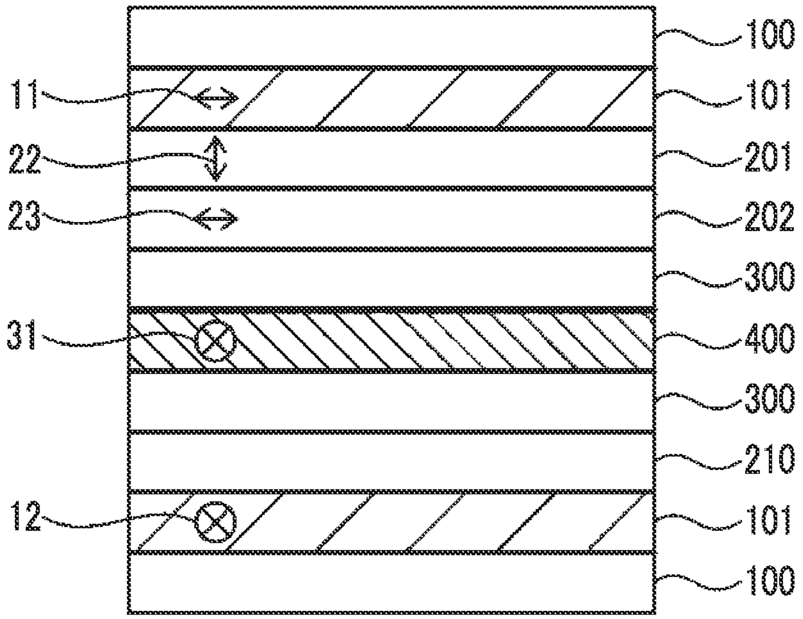
FIG. 1 is a cross-sectional view schematically illustrating a liquid crystal image display device of the related art.

Hereinafter, the present invention will be described in detail.

The description of constituent requirements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Further, in the present specification, the terms parallel, orthogonal, horizontal, and vertical do not indicate parallel, orthogonal, horizontal, and vertical in a strict sense, but indicate a range of parallel ±10°, a range of orthogonal ±10°, a range of horizontal ±10°, and a range of vertical ±10° respectively.

In the present specification, Re (λ) and Rth (λ) each represent an in-plane retardation at a wavelength λ and a retardation at a wavelength λ in a thickness direction. Further, in a case where the wavelength λ of the retardation is not specified, the wavelength λ is set to 550 nm.

In the present specification, Re (λ) and Rth (λ) are values measured at a wavelength λ using AxoScan OPMF-1 (manufactured by Optoscience. Inc.).

Specifically, the slow axis direction (°), "Re (λ)=R0 (λ)", and "Rth (λ)=((nx+ny)/2−nz)×d" are calculated by inputting the average refractive index ((nx+ny+nz)/3) and the film thickness (d(μm)) to AxoScan OPMF-1.

Further, R0 (λ) is displayed as a numerical value calculated by AxoScan OPMF-1 and denotes Re (λ).

In the present invention, refractive indices nx and ny are refractive indices in the in-plane direction of an optical member, and typically, nx represents a refractive index of a slow axis azimuth and ny represents a refractive index of a fast axis azimuth (that is, the azimuth orthogonal to the slow axis). Further, nz represents a refractive index in the thickness direction. nx, ny, and nz can be measured with an Abbe refractometer (NAR-4T, manufactured by Atago Co., Ltd.) using a sodium lamp (λ=589 nm) as a light source.

In a case of measuring the wavelength dependence, a multi-wavelength Abbe refractometer DR-M2 (manufactured by Atago Co., Ltd.) can be used in combination with an interference filter.

In addition, values from Polymer Handbook (John Wiley & Sons, Inc.) and catalogs of various optical films can also be used.

Further, in the present specification, materials corresponding to respective components may be used alone or in combination of two or more kinds thereof. Here, in a case where two or more kinds of substances corresponding to respective components are used in combination, the content of the components indicates the total content of the combined substances unless otherwise specified.

Further, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[I] Optical Laminate

An optical laminate according to the present invention includes a polarizer, a retardation layer including a cycloolefin-based polymer film, and a pressure sensitive adhesive layer in this order, and the polarizer includes a protective layer on at least one side.

Here, the expression "at least one side" denotes at least one of a surface of the polarizer on the retardation layer side or a surface of the polarizer on a side opposite to the retardation layer.

Further, the optical laminate according to the embodiment of the present invention satisfies Condition I and Condition III, or Condition II and Condition III.

Condition I: An interlayer is further provided between the retardation layer and the pressure sensitive adhesive layer.

Condition II: The pressure sensitive adhesive layer contains an organic low-molecular-weight component having a molecular weight of 500 or less, and a content of the organic low-molecular-weight component having a molecular weight of 500 or less is 2.6% by mass or less, or in a case where a durability test is performed at 115° C. for 100 hours in a state in which the retardation layer and the pressure sensitive adhesive layer are in direct contact with each other and the optical laminate is adhered to a glass substrate via the pressure sensitive adhesive layer, the content of the organic low-molecular-weight component having a molecular weight of 32 to 200 in the pressure sensitive adhesive layer after the durability test is 50% or less of the content thereof before the durability test.

Condition III: An in-plane retardation Re (550) and a thickness direction retardation Rth (550) of the entire retardation layer at a wavelength of 550 nm respectively satisfy Expressions (1) and (2).

$$0\ \text{nm} \le Re(550) \le 350\ \text{nm} \qquad \text{Expression (1):}$$

$$-200\ \text{nm} \le Rth(550) \le 200\ \text{nm} \qquad \text{Expression (2):}$$

FIG. 1 is a configuration view illustrating an example of an IPS type liquid crystal display device that is typically used for in-vehicle applications as an image display device of the related art.

Two polarizers 101 are provided to sandwich an IPS liquid crystal cell 400 such that the absorption axes (a first polarizer absorption axis 11 and a second polarizer absorption axis 12) are orthogonal to each other. Further, the reference numeral 31 represents a liquid crystal director direction (liquid crystal alignment direction) of the IPS liquid crystal cell 400.

Further, the two polarizers 101 are respectively provided with a protective film 100 on one side thereof.

Further, a liquid crystal layer (first retardation layer) 201 and a cycloolefin-based polymer film (second retardation layer) 202 are provided on a side of one (viewing side) polarizer 101, between the two polarizers 101, opposite to the protective film 100 via an adhesive (a PVA water glue adhesive or a UV adhesive), and the IPS liquid crystal cell 400 and the cycloolefin-based polymer film (second retardation layer) 202 are adhered to each other via a pressure sensitive adhesive layer 300. In addition, the reference numeral 22 represents a slow axis of the liquid crystal layer (first retardation layer) 201, and the reference numeral 23 represents a slow axis of the cycloolefin-based polymer film (second retardation layer) 202.

Further, a low retardation film 210 is provided on a side of the other (non-viewing side) polarizer 101, between the two polarizers 101, opposite to the protective film 100, and the IPS liquid crystal cell 400 and the low retardation film 210 are adhered to each other via the pressure sensitive adhesive layer 300.

Figure 2:
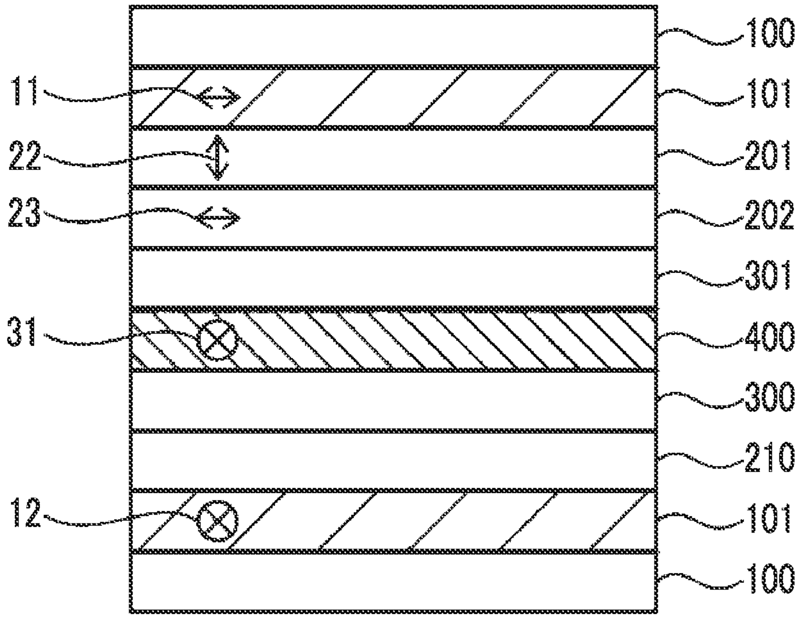
FIG. 2 is a cross-sectional view schematically illustrating an embodiment of an image display device according to the present invention.

The present inventors found that, in an optical laminate of an aspect in which the retardation layer and the pressure sensitive adhesive layer are in direct contact with each other, the durability is enhanced by using a low-molecular-weight reduction pressure sensitive adhesive layer 301, in which the content of the organic low-molecular-weight component (having a molecular weight of 500 or less) serving as an AS agent is 2.6% by mass or less, preferably 0.6% by mass or less, and more preferably 0.1% by mass or less, as the pressure sensitive adhesive layer adjacent to the cycloolefin-based polymer film (second retardation layer) 202 as illustrated in FIG. 2.

Further, the present inventors found that, in the optical laminate of the aspect in which the retardation layer and the pressure sensitive adhesive layer are in direct contact with each other, the durability is enhanced in a case where a durability test is performed at 115° C. for 100 hours in a state in which the optical laminate is adhered to a glass substrate via the pressure sensitive adhesive layer, and the content of the organic low-molecular-weight component having a molecular weight of 32 to 200 in the pressure sensitive adhesive layer after the durability test is 50% or less of the content thereof before the durability test.

Figure 3:
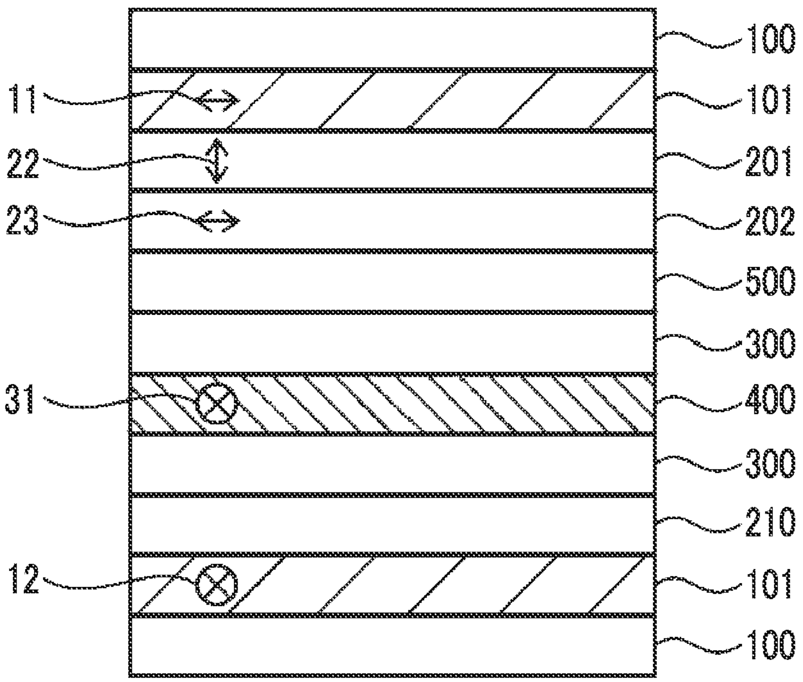
FIG. 3 is a cross-sectional view schematically illustrating another embodiment of the image display device according to the present invention.

Further, the present inventors found that the durability is enhanced in a case where an interlayer 500 is provided between the cycloolefin-based polymer film (second retardation layer) 202 and the pressure sensitive adhesive layer 300 as illustrated in FIG. 3 and the like. Hereinafter, each layer of the optical laminate according to the embodiment of the present invention will be described.

[1] Retardation Layer

The retardation layer is not particularly limited as long as the retardation layer includes a cycloolefin-based polymer film.

Further, the retardation layer may include only a single cycloolefin-based polymer film or a liquid crystal layer provided adjacent to a cycloolefin-based polymer film.

Further, in a case where the optical laminate according to the embodiment of the present invention includes a liquid crystal layer, the liquid crystal layer present on the polarizer side of the cycloolefin-based polymer film described above is regarded as a part of the retardation layer, and the liquid crystal layer present on the pressure sensitive adhesive layer side of the cycloolefin-based polymer film is regarded as the interlayer.

In the present invention, the liquid crystal layer may be formed of a liquid crystal composition containing a liquid crystal compound and a compound represented by Formula (I).

In this case, it is preferable that the composition contains 0.5% to 7.0% by mass of the compound represented by Formula (I) with respect to the mass of the liquid crystal compound.

In general, an infiltration layer in which a coating layer and a polymer film are mixed is formed at an interface between the polymer film and the coating layer in some cases.

Further, it is generally understood that the formation of such an infiltration layer is advantageous for adhesiveness.

However, from the viewpoint of the aligning properties of the liquid crystal layer, it is preferable that the infiltration layer is small in a case where alignment is inhibited due to extreme infiltration of the infiltration layer into the polymer film, and thus the alignment is deteriorated.

In a case where a compound represented by Formula (I) is used for forming the liquid crystal layer, it is preferable that the infiltration layer is small. It is considered that since the cycloolefin-based polymer film and the compound represented by Formula (I) effectively interact with each other, the aligning properties can be improved. Further, even in a case where the infiltration layer is present, the aligning properties are considered to be improved by locally unevenly distributing the compound represented by Formula (I).

Here, in the present invention, the term "infiltration layer" denotes a region where both the material of the cycloolefin-based polymer film and the material of the liquid crystal layer are detected. The thickness of the infiltration layer is preferably in a range of 30 to 300 nm and more preferably in a range of 50 to 250 nm. In a case where the thickness thereof is in the above-described ranges, the adhesiveness between the liquid crystal layer and the cycloolefin-based polymer film is satisfactory, and the aligning properties of the liquid crystal layer can be improved.

Next, the cycloolefin-based polymer film constituting the retardation layer and an optional liquid crystal layer will be described in detail.

[Cycloolefin-Based Polymer Film]

It is preferable that the cycloolefin-based polymer film of the optical laminate according to the embodiment of the present invention is transparent.

Here, the term "transparent" in the present specification denotes that the transmittance of visible light is 60% or greater. In the present invention, the transmittance is preferably 80% or greater and more preferably 90% or greater.

The content of the cycloolefin-based polymer is preferably 60% by mass or greater and more preferably 80% by mass or greater with respect to the total solid content in the cycloolefin-based polymer film.

Examples of the cycloolefin-based polymer include (1) a norbornene-based polymer, (2) a polymer of a monocyclic cycloolefin, (3) a polymer of a cyclic conjugated diene, (4) a vinyl alicyclic hydrocarbon polymer, and hydrides of (1) to (4). Specific suitable examples of the cycloolefin-based polymer include an addition (co)polymer cyclopolyolefin having at least one repeating unit represented by General Formula (III) and an addition (co)polymer cyclopolyolefin further having at least one repeating unit represented by General Formula (II) together with the repeating units represented by General Formula (III).

In addition, as the cycloolefin-based polymer, a ring-opened (co) polymer having at least one cyclic repeating unit represented by General Formula (IV) can also be suitably used.

General Formula (II)

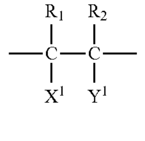

General Formula (III)

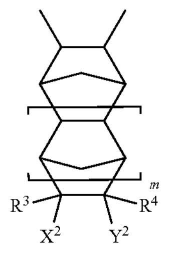

-continued

General Formula (IV)

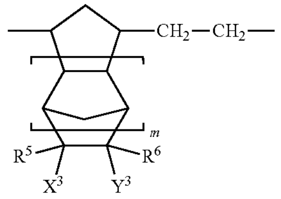

In General Formulae (II) to (IV), m represents an integer of 0 to 4. $R^1$ to $R^6$ each represent a hydrogen atom or a hydrocarbon group having 1 to 10 carbon atoms, and $X^1$ to $X^3$ and $Y^1$ to $Y^3$ each represent a hydrogen atom, a hydrocarbon group having 1 to 10 carbon atoms, a halogen atom, a hydrocarbon group having 1 to 10 carbon atoms which has been substituted with a halogen atom, $-(CH_2)_nCOOR^{11}$, $-(CH_2)_nOCOR^{12}$, $-(CH_2)_nNCO$, $-(CH_2)_nNO_2$, $-(CH_2)_nCN$, $-(CH_2)_nCONR^{13}R^{14}$, $-(CH_2)_nNR^{13}R^{14}$, $-(CH_2)_nOZ$, $-(CH_2)_nW$, or $(-CO)_2O$ or $(-CO)_2NR^{15}$ formed of of $X^1$ and $Y^1$, $X^2$ and $Y^2$, or $X^3$ and $Y^3$. Further, $R^{11}$, $R^{12}$, $R^{13}$, $R^{14}$, and $R^{15}$ each represent a hydrogen atom or a hydrocarbon group having 1 to 20 carbon atoms, Z represents a hydrocarbon group or a hydrocarbon group substituted with halogen, W represents $SiR^{16}{}_pD_{3-p}$, represents a hydrocarbon group having 1 to 10 carbon atoms, D represents a halogen atom, $-OCOR^{16}$, or $-OR^{16}$, and p represents an integer of 0 to 3), and n represent an integer of 0 to 10.

In General Formulae (II) to (IV), Rth of the optical film is increased and expression properties of Re can be increased by introducing a functional group having high polarizability to the substituents of $X^1$ to $X^3$ and $Y^1$ to $Y^3$. In a film having high expression properties of Re, the Re value can be increased by stretching the film in a film forming process.

As the cycloolefin-based polymer used in the present invention, those disclosed in JP1998-7732A (JP-H10-7732A), JP2002-504184A, the specification of US2004229157A1, and the pamphlet of WO2004/070463A1 can be used. The cycloolefin-based polymer can be obtained by addition polymerization of norbornene-based polycyclic unsaturated compounds. In addition, as necessary, a norbornene-based polycyclic unsaturated compound can be addition-polymerized with a conjugated diene such as ethylene, propylene, butene, butadiene, or isoprene; a non-conjugated diene such as ethylidene norbornene; or a linear diene compound such as acrylonitrile, acrylic acid, methacrylic acid, maleic acid anhydride, acrylic acid ester, methacrylic acid ester, maleimide, vinyl acetate, or vinyl chloride.

A commercially available product can also be used as the norbornene-based addition (co)polymer. Specifically, APEL (trade name, manufactured by Mitsui Chemicals, Inc.) is commercially available, and examples thereof include products with grades such as APL8008T (Tg of 70° C.), APL6013T (Tg of 125° C.), and APL6015T (Tg of 145° C.) with different glass transition temperatures (Tg). Other examples of commercially available products thereof include pellets such as TOPAS 8007, 6013, and 6015 (manufactured by Polyplastics Co., Ltd.). Further, Appear 3000 (manufactured by Ferrania, Inc.) is commercially available.

As the norbornene-based polymer hydride, those obtained by performing addition-polymerizing or methathesis-ring-opening polymerization and hydrogenating polycyclic unsaturated compounds, as disclosed in JP1989-240517A (JP-H1-240517A), JP1995-196736A (JP-H7-196736A), JP1985-26024A (JP-560-26024A), JP1987-19801A (JP-562-19801A), JP2003-1159767A, and JP2004-309979A can be used.

In the norbornene-based polymer used in the present invention, it is preferable that $R^5$ to $R^6$ in General Formula (IV) represent a hydrogen atom or $—CH_3$ and that $X^3$ and $Y^3$ in General Formula (IV) represent a hydrogen atom, Cl, or $—COOCH_3$, and other groups are appropriately selected.

Specific examples of commercially available products of the norbornene-based resin include Arton G and Arton F (trade names, manufactured by JSR Corporation), Zeonor ZF14, Zeonor ZF16, Zeonex 250, and Zeonex 280 (all trade names, manufactured by Zeon Corporation), and these can be used.

The mass average molecular weight (Mw) of the cycloolefin-based polymer used in the present invention, which is measured by gel permeation chromatography (GPC), is preferably in a range of 5,000 to 1,000,000, more preferably in a range of 10,000 to 500,000, and still more preferably in a range of 50,000 to 300,000 in terms of polystyrene molecular weight. Further, the molecular weight distribution (Mw/Mn; Mn represents the number average molecular weight measured by GPC) is preferably 10 or less, more preferably 5.0 or less, and still more preferably 3.0 or less.

The glass transition temperature (Tg) of the cycloolefin-based polymer used in the present invention, which is measured by differential scanning calorimetry (DSC), is preferably in a range of 50° C. to 350° C., more preferably in a range of 80° C. to 330° C., and still more preferably in a range of 100° C. to 200° C.

The cycloolefin-based polymer used in the present invention may contain an additive within a range not departing from the gist of the present invention, and the description of paragraphs 0025 to 0074 and 0086 to 0091 of JP2009-114303A can be referred to and the contents thereof can be incorporated in the specification of the present application.

{Water Contact Angle of Cycloolefin-Based Polymer Film}

In a case where the retardation layer includes an optional liquid crystal layer, it is preferable that the cycloolefin-based polymer film of the optical laminate according to the present invention is subjected to a surface treatment such that the water contact angle on a surface adjacent to the liquid crystal layer is set to be in a range of 5° to 65°. In addition, the water contact angle of the polymer film is more preferably in a range of 5° to 55° and particularly preferably in a range of 5° to 50°.

<<Method of Measuring Water Contact Angle>>

In the present invention, the water contact angle denotes a value measured by the following method.

The water contact angle is measured by a static drop method in conformity with JIS R 3257: 1999.

In addition, the measurement is performed using LSE-ME1 (software 2win mini, manufactured by Nic Corporation). Specifically, 2 μL of liquid droplets are dropped onto a surface of a polymer film kept horizontal at a room temperature (20° C.) using pure water, and the contact angle is measured 20 seconds after the dropping.

{Optical Characteristics of Cycloolefin-Based Polymer Film}

From the viewpoint of improving the display performance in a case where the optical laminate according to the embodiment of the present invention is used in an image display device, the optical characteristics of the cycloolefin-based polymer film of the retardation layer satisfy preferably Expressions (1) and (2), more preferably Expressions (1-1) and (2-1), and still more preferably Expressions (1-2) and (2-2).

In addition, as described in Condition III above, the optical characteristics of the entire retardation layer of the optical laminate according to the embodiment of the present invention are required to satisfy Expressions (1) and (2) and satisfy preferably Expressions (1-3) and (2-3) and more preferably Expressions (1-4) and (2-4).

$$0\ nm \le Re(550) \le 350\ nm \quad \text{Expression (1):}$$

$$-200\ nm \le Rth(550) \le 200\ nm. \quad \text{Expression (2):}$$

$$40\ nm \le Re(550) \le 200\ nm \quad \text{Expression (1-1):}$$

$$0\ nm \le Rth(550) \le 200\ nm \quad \text{Expression (2-1):}$$

$$80\ nm \le Re(550) \le 150\ nm \quad \text{Expression (1-2):}$$

$$40\ nm \le Rth(550) \le 150\ nm \quad \text{Expression (2-2):}$$

$$60\ nm \le Re(550) \le 300\ nm \quad \text{Expression (1-3):}$$

$$-100\ nm \le Rth(550) \le 100\ nm \quad \text{Expression (2-3):}$$

$$80\ nm \le Re(550) \le 160\ nm \quad \text{Expression (1-4):}$$

$$-80\ nm \le Rth(550) \le 20\ nm \quad \text{Expression (2-4):}$$

{Stretching of Cycloolefin-Based Polymer Film}

Various characteristics of the cycloolefin-based polymer film of the retardation layer can be adjusted by being stretched. Specifically, the in-plane retardation (Re), the retardation (Rth) in the thickness direction, and an optional film thickness can be expressed by stretching (uniaxially or biaxially stretching) the cycloolefin-based polymer film in a longitudinal direction (transport direction) and a lateral direction (width direction). Further, the stretching method is not limited to the above-described method, and the stretching can be realized by a method of stretching the cycloolefin-based polymer film in the plane as well as in the thickness direction while performing a heat treatment on the film in a state where a thermal shrinking film disclosed in WO10/082620A is bonded to the film. Hereinafter, typical machine-direction stretching and cross-direction stretching will be described in detail.

Stretching and relaxation may be combined to adjust the characteristics. For example, each treatment described in the following (a) to (k) can be performed.

(a) Cross-direction stretching
(b) Machine-direction stretching
(c) Cross-direction stretching→relaxation treatment
(d) Machine-direction stretching→relaxation treatment
I Machine-direction stretching→cross-direction stretching
(f) Machine-direction stretching→cross-direction stretching→relaxation treatment
(g) Machine-direction stretching→relaxation treatment→cross-direction stretching→relaxation treatment
(h) Cross-direction stretching→machine-direction stretching→relaxation treatment
(i) Cross-direction stretching→relaxation treatment→machine-direction stretching→relaxation treatment
(j) Machine-direction stretching→cross-direction stretching→machine-direction stretching
(k) Machine-direction stretching→cross-direction stretching→machine-direction stretching→relaxation treatment Among these, the cross-direction stretching step (a) and the machine-direction stretching step (b) are particularly important.

<Machine-Direction Stretching>

In a case where the cycloolefin-based polymer film is stretched in the longitudinal direction, for example, the cycloolefin-based polymer film is preheated with a plurality of preheating rollers, and the cycloolefin-based polymer film can be subjected to a stretching process in the longitudinal direction by providing a difference in circumferential speed to a pair of stretching rollers.

In this machine-direction stretching step, as described in paragraphs [0036] to [0045] of JP2008-213332A, an appropriate tension may be applied between preheating rollers in order to prevent occurrence of wrinkles by gradually increasing the circumferential speed of a plurality of preheating rollers and stretching rollers on the upstream side toward the downstream based on a change between the temperatures before and after contact of the film to each roller.

In addition, as described in paragraphs [0022] to [0031] of JP2011-207168A, the film may be rapidly cooled by a cooling roller after machine-direction stretching in order to suppress occurrence of scratches.

<Cross-Direction Stretching>

In a case where the cycloolefin-based polymer film is cross-direction-stretched, the cycloolefin-based polymer film can be subjected to stretching processing in the lateral direction by using, for example, a tenter. That is, both end portions of the cycloolefin-based polymer film in the width direction are gripped with a clip, and the width is extended in the lateral direction to stretch the film. At this time, the stretching temperature can be controlled by blowing air at a desired temperature into the tenter.

In the present specification, "stretching temperature" (hereinafter, also referred to as "cross-direction stretching temperature") is specified by the film surface temperature of the cycloolefin-based polymer film.

It is preferable that the stretching temperature is controlled to be in a range of Tg−40° C. to Tg+40° C. That is, the cross-direction stretching temperature in the cross-direction stretching step is preferably in a range of Tg−40° C. to Tg+40° C., more preferably in a range of Tg−20° C. to Tg+20° C., and still more preferably in a range of Tg−10° C. to Tg+10° C. Here, the cross-direction stretching temperature in the cross-direction stretching step denotes an average temperature between a stretching start point and a stretching end point.

The stretching time in the cross-direction stretching step is preferably in a range of 1 second to 10 minutes, more preferably in a range of 2 seconds to 5 minutes, and still more preferably in a range of 5 seconds to 3 minutes. In a case where the stretching temperature and the stretching time are controlled to be in the above-described ranges, the Re, the Rth, and the film thickness can be adjusted to be in the preferable ranges of the present invention.

Further, the cross-direction stretching ratio is preferably in a range of 1.01 to 4 times, more preferably in a range of 1.03 to 3.5 times, and still more preferably 1.1 to 3.0 times. The cross-direction stretching ratio is particularly preferably in a range of 1.51 to 3.0 times.

<Simultaneous Biaxial Stretching>

In a case where the cycloolefin-based polymer film is subjected to simultaneous biaxial stretching, the film can be subjected to stretching processing simultaneously in the longitudinal direction and the lateral direction by extending the width of the film in the lateral direction using a clip and stretching and contracting the film in the longitudinal direction simultaneously with the extending of the width, using the same method as a typical cross-direction stretching method. Specifically, any of the methods described in JP-1980-93520A (JP-555-93520U), JP-1998-247021A (JP-563-247021A), JP-1994-210726A (JP-H6-210726A), JP-1994-278204A (JP-H6-278204A), JP-2000-334832A, JP-2004-106434A, JP-2004-106434A, JP2004-195712A, JP2006-142595A, JP2007-210306A, JP2005-22087A, JP2006-517608A, and JP-A-2007-210306A can also be referred to.

In a case where the film is preheated before being stretched and then thermally fixed after being stretched, the Re and Rth distributions after the stretching can be reduced, and the variation in the alignment angle due to bowing can be reduced. Any one of the preheating or the thermal fixing may be performed, but it is more preferable that both are performed. It is preferable that the preheating and the thermal fixing are performed by gripping the film with a clip, that is, it is preferable that the preheating and the thermal fixing are performed continuously with stretching.

The preheating can be performed at a temperature higher than the stretching temperature by approximately 1° C. to 50° C., preferably 2° C. to 40° C., and more preferably 3° C. or higher and 30° C. or lower. The preheating time is preferably 1 second or longer and 10 minutes or shorter, more preferably 5 seconds or longer and 4 minutes or shorter, and still more preferably 10 seconds or longer and 2 minutes or shorter. It is preferable that the width of the tenter is kept substantially constant during the preheating. Here, "substantially" denotes ±10% of the width of the unstretched film.

The thermal fixing can be performed at a temperature lower than the stretching temperature by 1° C. or higher and 50° C. or lower, more preferably 2° C. or higher and 40° C. or lower, and still more preferably 3° C. or higher and 30° C. or lower. The temperature of the thermal fixing is even still more preferably the stretching temperature or lower and Tg or lower. The preheating time is preferably 1 second or longer and 10 minutes or shorter, more preferably 5 seconds or longer and 4 minutes or shorter, and still more preferably 10 seconds or longer and 2 minutes or shorter. It is preferable that the width of the tenter is kept substantially constant during the thermal fixing. Here, "substantially" denotes 0% to −10% (the same width as the tenter width after stretching) to −10% (the width is reduced by 10% from the tenter width after stretching=reduced width) of the tenter width after the completion of stretching. In a case where the width of the tenter is extended to be greater than or equal to the stretching width, a residual strain is likely to occur in the polymer film, and fluctuations in Re and Rth with time are likely to increase, which is not preferable.

Further, the variations of Re and Rth in the width direction and the longitudinal direction can be further reduced by the above-described stretching to 5% or less, more preferably 4% or less, and still more preferably 3% or less.

A high-speed stretching treatment may be performed, and the stretching treatment can be carried out preferably at 20 m/min or greater, more preferably at 25 m/min or greater, and still more preferably at 30 m/min or greater.

In the present invention, the cycloolefin-based polymer film has a slow axis parallel to the transport direction. The degree of parallelism is made such that the angle between the transport direction and the slow axis is set to 0°±8° or less, preferably 0°±5° or less, more preferably 0°±3° or less, and still more preferably 0°±1° or less.

The thickness of the cycloolefin-based polymer film is preferably 30 μm or less, more preferably in a range of 5 μm to 30 μm, still more preferably in a range of 7 μm to 25 μm, and particularly preferably in a range of 10 μm to 20 μm.

[Protective Film]

From the viewpoint of preventing blocking during winding and stabilizing transport, the cycloolefin-based polymer film can be provided with a protective film on a side opposite to a surface to be coated. In addition, a protective film can be provided on the side of the coated surface after the coating. The protective film is peeled off at a stage where the protective film is no longer necessary, for example, during processing of a polarizing plate. From the viewpoint of ease of handling, a polyethylene-based resin, a polypropylene-based resin, a polystyrene-based resin, a polyethylene terephthalate-based resin, or the like can be preferably used as the material of the protective film, and a film obtained by molding one or two or more of these films in the form of a single layer or a multilayer can be used as the protective film. Among these, a self-pressure sensitive adhesive protective film which has pressure sensitive adhesiveness to a polarizing film by itself is simple in terms that the pressure sensitive adhesive layer on the surface of the protective film is not required to be protected, and thus can be used more preferably. Examples of commercially available products of the self-pressure sensitive adhesive resin film include TORETEC (manufactured by Toray Industries, Inc.) consisting of a polyethylene resin.

In a case where the cycloolefin-based polymer film includes a protective film, it is assumed that the target (entire retardation layer) that satisfies Condition III does not include the protective film.

[Liquid Crystal Layer]

The optional liquid crystal layer of the retardation layer is an optional layer provided adjacent to the cycloolefin-based polymer film described above and preferably a liquid crystal layer formed of a liquid crystal composition containing a liquid crystal compound described below. Further, it is preferable that the liquid crystal composition contains 0.5% to 7.0% by mass of the compound represented by Formula (I) with respect to the mass of the liquid crystal compound.

In addition, the description of the liquid crystal layer in the present specification applies to a liquid crystal layer that is regarded as an interlayer, that is, a liquid crystal layer that is present on the pressure sensitive adhesive layer side of the cycloolefin-based polymer film.

{Optical Characteristics of Liquid Crystal Layer}

From the viewpoint of improving the display performance in a case where the optical laminate according to the embodiment of the present invention is used in an image display device, the optical characteristics of the liquid crystal layer satisfy Expressions (4) and (5) in a case of a rod-like liquid crystal compound and preferably Expressions (6) and (7) in a case of a discotic liquid crystal compound.

$$0\ \text{nm} \leq Re2(550) \leq 10\ \text{nm} \quad \text{Expression (4):}$$

$$-360\ \text{nm} \leq Rth2(550) \leq -50\ \text{nm} \quad \text{Expression (5):}$$

$$10\ \text{nm} \leq Re2(550) \leq 220\ \text{nm} \quad \text{Expression (6):}$$

$$-110\ \text{nm} \leq Rth2(550) \leq -5\ \text{nm} \quad \text{Expression (7):}$$

Further, the optical characteristics of the liquid crystal layer satisfy preferably Expressions (4-1) and (5-1) and more preferably Expressions (4-2) and (5-2) in a case of a rod-like liquid crystal compound. Further, the optical characteristics of the liquid crystal layer satisfy preferably Expressions (6-1) and (7-1) and more preferably Expressions (6-2) and (7-2) in a case of a discotic liquid crystal compound.

$$0\ \text{nm} \leq Re2(550) \leq 5\ \text{nm} \quad \text{Expression (4-1):}$$

$$-270\ \text{nm} \leq Rth2(550) \leq -50\ \text{nm} \quad \text{Expression (5-1):}$$

$$20\ \text{nm} \leq Re2(550) \leq 200\ \text{nm} \quad \text{Expression (6-1):}$$

$$-100\ \text{nm} \leq Rth2(550) \leq -10\ \text{nm} \quad \text{Expression (7-1):}$$

$$0\ \text{nm} \leq Re2(550) \leq 1\ \text{nm} \quad \text{Expression (4-2):}$$

$$-180\ \text{nm} \leq Rth2(550) \leq -100\ \text{nm} \quad \text{Expression (5-2):}$$

$$60\ \text{nm} \leq Re2(550) \leq 160\ \text{nm} \quad \text{Expression (6-2):}$$

$$-80\ \text{nm} \leq Rth2(550) \leq -30\ \text{nm} \quad \text{Expression (7-2):}$$

The thickness of the liquid crystal layer is not particularly limited, but is preferably in a range of 0.1 μm to 10 μm, more preferably in a range of 0.3 μm to 8 μm, and still more preferably in a range of 0.5 μm to 5 μm.

[Liquid Crystal Compound]

The liquid crystal composition forming the liquid crystal layer contains a liquid crystal compound.

The liquid crystal compound is preferably a rod-like liquid crystal compound or a discotic liquid crystal compound and more preferably a rod-like liquid crystal compound from the viewpoint of improving the display performance in a case where the optical laminate according to the embodiment of the present invention is used in an image display device.

In addition, as described in Condition III above, the optical characteristics of the entire retardation layer of the optical laminate according to the embodiment of the present invention are required to satisfy Expressions (1) and (2) and satisfy preferably Expressions (1-3) and (2-3) and more preferably Expressions (1-4) and (2-4).

$$0\ \text{nm} \leq Re(550) \leq 350\ \text{nm} \quad \text{Expression (1):}$$

$$-200\ \text{nm} \leq Rth(550) \leq 200\ \text{nm}. \quad \text{Expression (2):}$$

$$60\ \text{nm} \leq Re(550) \leq 300\ \text{nm} \quad \text{Expression (1-3):}$$

$$-100\ \text{nm} \leq Rth(550) \leq 100\ \text{nm} \quad \text{Expression (2-3):}$$

$$80\ \text{nm} \leq Re(550) \leq 160\ \text{nm} \quad \text{Expression (1-4):}$$

$$-80\ \text{nm} \leq Rth(550) \leq 20\ \text{nm} \quad \text{Expression (2-4):}$$

The rod-like liquid crystal compounds that can be used are described in, for example, paragraphs [0045] to [0066] of JP2009-217256A, and the contents thereof are incorporated in the present specification.

The discotic liquid crystal compound is described in, for example, paragraphs [0025] to of JP2006-301614A, paragraphs [0020] to [0122] of JP2007-108732A, and paragraphs to [0108] of JP2010-244038A, and the contents thereof are incorporated in the present specification.

It is preferable that the liquid crystal compound is immobilized in a vertically aligned state in order to adjust the optical characteristics of the liquid crystal layer. For example, a layer in which a rod-like liquid crystal compound is immobilized in a vertically aligned state can function as a positive C-plate. In addition, a layer in which a discotic liquid crystal compound is immobilized in a vertically aligned state can function as a negative A-plate.

In the present invention, the vertical alignment denotes an alignment state in which the normal direction of a layer and the major axis direction of a liquid crystal molecule are parallel to each other in a case of a rod-like liquid crystal compound and denotes an alignment state in which the normal direction of a layer and the disc plane of a liquid crystal molecule are parallel to each other in a case of a discotic liquid crystal compound. Further, it is particularly preferable that the major axis direction of a liquid crystal molecule and the disc plane of a liquid crystal molecule are parallel to the normal direction of a layer, but the liquid crystal molecule may have an inclination depending on the alignment state of the liquid crystal molecule. This inclination is preferably within 3.5°.

Here, it is preferable that the optical characteristics of the liquid crystal layer satisfy Expressions (4) and (5) in a case where a rod-like liquid crystal compound is vertically aligned and that the optical characteristics thereof satisfy Expressions (6) and (7) in a case where a discotic liquid crystal compound is vertically aligned.

{Compound Represented by Formula (I)}

It is preferable that the liquid crystal composition forming the liquid crystal layer contains a compound represented by Formula (I).

$$(Z)_m\text{-}L^{100}\text{-}(Q)_m \qquad \text{Formulas (I)}$$

Here, in Formula (I), Z represents a substituent containing a polymerizable group, n represents an integer of 0 to 4, and in a case where n represents an integer of 2 to 4, two or more of Z's may be the same as or different from each other.

Further, Q represents a substituent having at least one boron atom, m represents 1 or 2, and in a case where m represents 2, two Q's may be the same as or different from each other.

Further, $L^{100}$ represents an (n+m)-valent linking group. Here, in a case where n represents 0 and m represents 1, $L^{100}$ represents a hydrogen atom, a substituted or unsubstituted alkyl group, a substituted or unsubstituted alkenyl group, a substituted or unsubstituted alkynyl group, a substituted or unsubstituted aryl group, or a substituted or unsubstituted heteroaryl group.

In Formula (I), examples of the substituent containing a polymerizable group represented by Z include a substituent containing a (meth)acrylate group, a styryl group, a vinyl ketone group, a butadiene group, a vinyl ether group, an oxiranyl group, an aziridinyl group, or an oxetane group.

Among these, a substituent containing a (meth)acrylate group, a styryl group, an oxiranyl group, or an oxetane group is preferable, and a substituent containing a (meth)acrylate group or a styryl group is more preferable.

In particular, as the substituent containing a (meth)acrylate group, a group having an ethylenically unsaturated double bond represented by General Formula (V) is preferable.

General Formula (V)

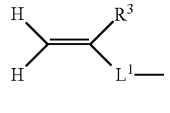

In General Formula (V), $R^3$ represents a hydrogen atom or a methyl group and preferably a hydrogen atom.

In General Formula (V), $L^1$ represents a single bond or a divalent linking group selected from the group consisting of O—, —CO—, —NH—, —CO—NH—, —COO—, —O—COO—, an alkylene group, an arylene group, a heterocyclic group, and a combination thereof, preferably a single bond, —CO—NH—, or —COO—, and particularly preferably a single bond or —CO—NH—.

In Formula (I), n represents an integer of 0 to 4, preferably 0 or 1, and more preferably 1.

Further, m represents 1 or 2 and preferably 1.

Further, $L^{100}$ as a divalent linking group may represent a single bond or a divalent linking group selected from —O—, —CO—, —NH—, —CO—NH—, —COO—, —O—COO—, an alkylene group, an arylene group, a heteroarylene group, and a combination thereof.

Among these, it is more preferable that L represents a substituted or unsubstituted arylene group.

Further, in the alkyl group, the alkenyl group, the alkynyl group, the aryl group, and the heteroaryl group represented by $L^{100}$, $R^1$ and $R^2$ in General Formula (VI) have the same definition, and the preferable ranges thereof are also the same as described above.

Further, examples of the substituents contained in these groups include the substituents described in paragraph [0046] of JP2013-054201A.

In Formula (I), Q represents a substituent having at least one boron atom and preferably a group that can be adsorbed and bonded to a polymer film.

For example, in a case where the polymer film contains a hydroxyl group or a carboxyl group on the surface by a surface treatment or the like, a group capable of bonding to the hydroxyl group or the carboxyl group of the polymer film is preferable. In addition, the expression "group that can be adsorbed and bonded to a polymer film" denotes a group that can be chemically adsorbed to the polymer film by interacting with the structure of the material constituting the polymer film.

Examples of the substituent having at least one boron atom include a substituent represented by General Formula (VI).

General Formula (VI)

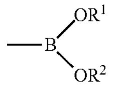

In General Formula (VI), $R^1$ and $R^2$ each independently represent a hydrogen atom, a substituted or unsubstituted aliphatic hydrocarbon group, a substituted or unsubstituted aryl group, or a substituted or unsubstituted heteroaryl group. Further, in $R^1$ and $R^2$ in General Formula (VI), $R^1$ and $R^2$ may be linked to each other to form a linking group consisting of an alkylene group, an aryl group, or a combination thereof.

In General Formula (VI), the substituted or unsubstituted aliphatic hydrocarbon groups respectively represented by $R^1$ and $R^2$ include a substituted or unsubstituted alkyl group, a substituted or unsubstituted alkenyl group, and a substituted or unsubstituted alkynyl group.

Specific examples of the alkyl group include a linear, branched, or cyclic alkyl group such as a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-methylhexyl group, a cyclopentyl group, a cyclohexyl group, a 1-adamantyl group, or a 2-norbornyl group.

Specific examples of the alkenyl group include a linear, branched, or cyclic alkenyl group such as a vinyl group, a 1-propenyl group, a 1-butenyl group, a 1-methyl-1-propenyl group, a 1-cyclopentenyl group, or a 1-cyclohexenyl group.

Specific examples of the alkynyl group include an ethynyl group, a 1-propynyl group, a 1-butynyl group, and a 1-octynyl group.

Specific examples of the aryl group include those in which one to four benzene rings form a fused ring and those in which a benzene ring and an unsaturated five-membered ring form a fused ring, and specific examples thereof include a phenyl group, a naphthyl group, an anthryl group, a phenanthryl group, an indenyl group, an acenabutenyl group, a fluorenyl group, and a pyrenyl group.

In General Formula (VI), examples of the substituted or unsubstituted heteroaryl groups respectively represented by $R^1$ and $R^2$ include those obtained by removing one hydrogen atom on a heteroaromatic ring that has one or more heteroatoms selected from the group consisting of a nitrogen atom, an oxygen atom, and a sulfur atom to obtain a heteroaryl group.

Specific examples of the heteroaromatic ring having one or more heteroatoms selected from the group consisting of a nitrogen atom, an oxygen atom, and a sulfur atom include pyrrole, furan, thiophene, pyrazole, imidazole, triazole, oxazole, isoxazole, oxadiazole, thiazole, thiadiazole, indole, carbazole, benzofuran, dibenzofuran, thianaphthene, dibenzothiophene, indazole benzimidazole, anthranil, benzisoxazole, benzoxazole, benzothiazole, purine, pyridine, pyridazine, pyrimidine, pyrazine, triazine, quinoline, acridine, isoquinoline, phthalazine, quinazoline, quinoxaline, naphthyridine, phenanthroline, and pteridine.

It is preferable that $R^1$ and $R^2$ in General Formula (VI) represent a hydrogen atom.

Further, $R^1$ and $R^2$ in General Formula (VI) and $L^{100}$ in Formula (I) may be further substituted with one or more substituents where possible. One or more of these hydrocarbon groups may be substituted with optional substituent. Examples of the substituent include a monovalent nonmetallic atomic group excluding hydrogen.

The molecular weight of the compound represented by Formula (I) is preferably in a range of 120 to 1,200 and more preferably in a range of 180 to 800.

Specific examples of the compound represented by Formula (I) include the following compounds other than the compounds exemplified as the specific examples described in paragraphs [0035] to [0040] of JP2007-219193A, and the contents thereof are incorporated in the specification of the present application. It goes without saying that the present invention is not limited to these specific examples.

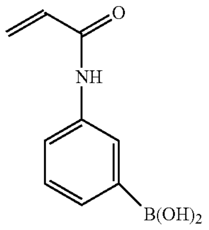
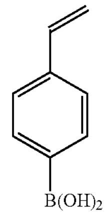
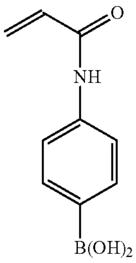
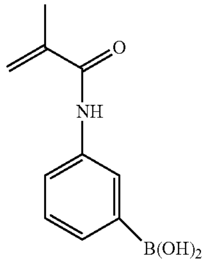
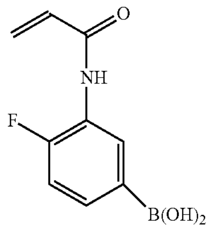
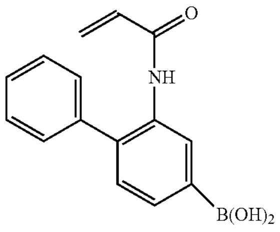
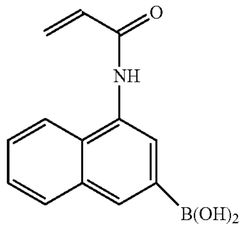
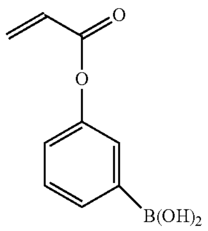
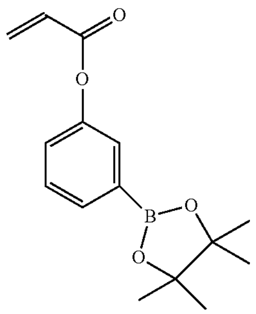
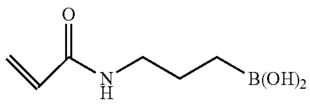
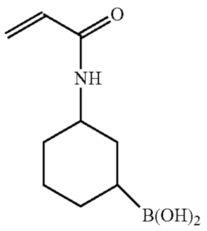
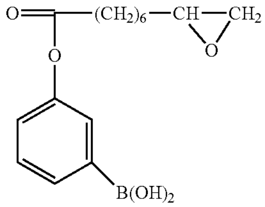
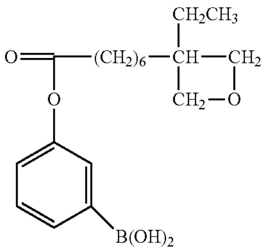
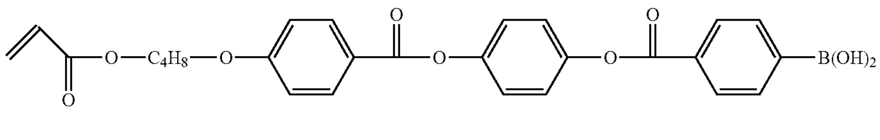

-continued

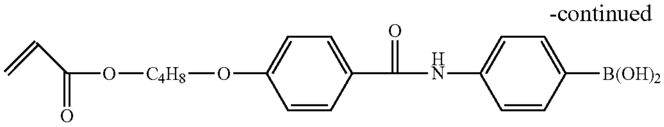

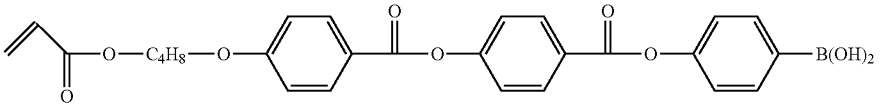

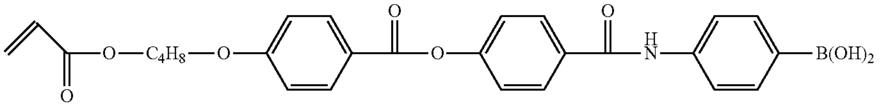

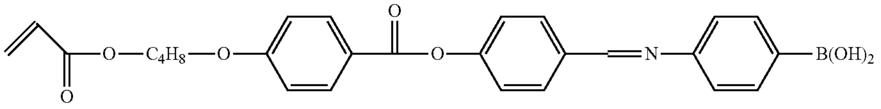

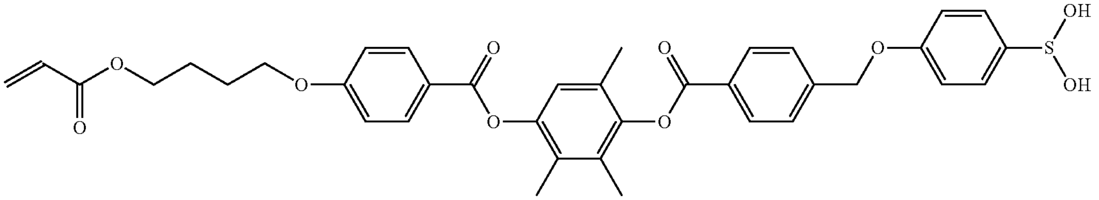

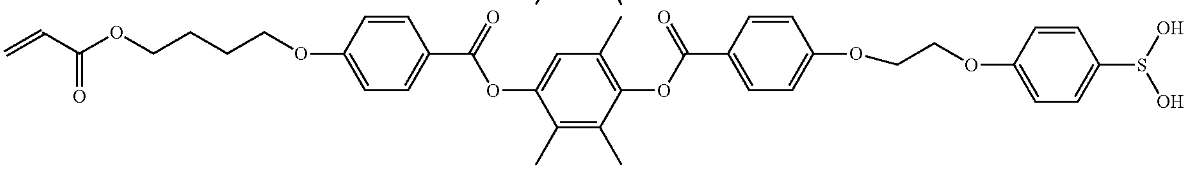

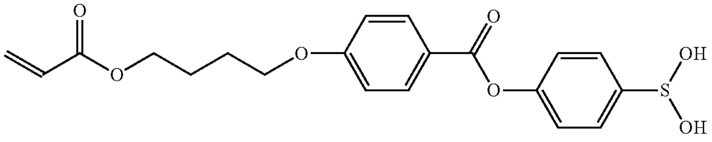

As described above, the content of the compound represented by Formula (I) is preferably in a range of 0.5% to 7% by mass, more preferably in a range of 1% to 5% by mass, and still more preferably in a range of 3% to 5% by mass with respect to the mass of the liquid crystal compound in the liquid crystal composition.

The adhesiveness can be improved by setting the blending amount of the compound represented by Formula (I) to 0.5% by mass or greater and the aligning properties can be improved by setting the blending amount thereof to 7% by mass or less. In a case where the liquid crystal composition contains a plurality of kinds of liquid crystal compounds, the proportion thereof is the total amount of the compounds.

In the present invention, it is preferable that the compound represented by Formula (I) is unevenly distributed in the liquid crystal layer on a side close to the polymer film in the film thickness direction. The concept “unevenly distributed” here includes not only a case where the compound itself is unevenly distributed but also a case where the liquid crystal layer is a polymer of a liquid crystal composition and the polymer is unevenly distributed as a reaction product after the polymerization.

{Other Additives}

Other additives may be blended in the liquid crystal layer or the liquid crystal composition forming the liquid crystal layer within a range not departing from the gist of the present invention.

Examples of other additives include a vertical alignment agent. As the vertical alignment agent, a pyridinium compound or an onium compound is preferably used, and in a case where the liquid crystal composition contains such compounds, the compounds act as a vertical alignment agent that promotes vertical alignment of the liquid crystal compound at the interface of the polymer film and also contribute to improvement of the adhesiveness of the interface between the liquid crystal layer in which the alignment state of the liquid crystal compound is fixed and the polymer film. The pyridinium compound is described in, for example, paragraphs [0030] to [0052] of JP2007-093864A, and the onium compound is described in, for example, paragraphs [0027] to [0058] of JP2012-208397A, and the contents thereof are incorporated in the present specification.

In addition, the liquid crystal layer in which the alignment state of the liquid crystal compound is fixed may contain an air interface-side alignment control agent (for example, a copolymer having a repeating unit that contains a fluoroaliphatic group) for controlling the alignment on the air interface side as necessary.

In addition, for example, a polymerization initiator can be blended in the liquid crystal composition. As the polymerization initiator, the description in paragraphs [0099] and [0100] of JP2010-84032A and paragraphs [0065] to [0067] of JP2007-219193A can be referred to, and the contents thereof are incorporated in the specification of the present application.

Examples of commercially available products thereof include IRGACURE 907, 184, 819, TPO, OXE01, OXE02, 127, and 2959 (manufactured by BASF SE), and these polymerization initiators may be used in combination of two or more kinds thereof. In addition, various sensitizers such as benzophenones and thioxanthones, and various chain transfer agents can also be used in combination. Examples of the chain transfer agents include thiols, and examples of commercially available products thereof include KARENZ MT I PE1, BD1, and NR1 (manufactured by Showa Denko K.K.).

In addition, the liquid crystal composition may contain a non-liquid crystal polymerizable monomer. As the polymerizable monomer, a compound containing a vinyl group, a vinyloxy group, an acryloyl group, or a methacryloyl group is preferable. Specific examples thereof include polyfunctional monomers containing two or more polymerizable reactive functional groups, for example, an ester of a polyhydric alcohol and (meth)acrylic acid [such as ethylene glycol di(meth)acrylate, butanediol di(meth)acrylate, hexanediol di(meth)acrylate, 1,4-cyclohexane diacrylate, pentaerythritol tetra(meth)acrylate, pentaerythritol tri(meth) acrylate, trimethylolpropane tri(meth)acrylate, trimethylol ethanetri(meth)acrylate, dipentaerythritol tetra(meth)acrylate, dipentaerythritol penta(meth)acrylate, dipentaerythritol hexa(meth)acrylate, pentaerythritol hexa(meth)acrylate, 1,2,3-cyclohexane tetramethacrylate, polyurethane polyacrylate, or polyester polyacrylate], the above-described ethylene oxide-modified product, vinylbenzene, and derivatives thereof (such as 1,4-divinylbenzene, 4-vinylbenzoic acid-2-acryloylethyl ester, and 1,4-divinylcyclohexanone), vinyl sulfone (such as divinyl sulfone), acrylamide (such as methylene bisacrylamide), and methacrylamide. The monomers may be used in combination of two or more kinds thereof <Method of Producing Retardation Layer>

It Is preferable that a method of producing the retardation layer including an optional liquid crystal layer (hereinafter, also simply referred to as "present production method") includes a surface treatment step of performing a surface treatment on the surface of the cycloolefin-based polymer film such that the water contact angle is set to be in a range of 5° to 65° and a liquid crystal layer forming step of bringing the liquid crystal composition containing a liquid crystal compound and a solvent into contact with the surface subjected to the surface treatment and forming a liquid crystal layer.

[Surface Treatment Step]

The surface treatment step in the present production method is a step of performing a surface treatment on the surface of the cycloolefin-based polymer film such that the water contact angle is set to be in a range of 5° to 65°. A method of measuring the water contact angle is as described above.

Further, it is preferable that the surface treatment step is a step of adding a hydroxyl group or a carboxyl group to the surface of the cycloolefin-based polymer film. Specific examples of the surface treatment include various known treatments. Among these, a corona treatment is preferable.

{Corona Treatment}

The corona treatment can be carried out by, for example, any of the treatment methods described in JP1964-12838B (JP-539-12838B), JP1972-19824A (JP-547-19824A), JP-1973-28067A (JP-548-28067A), and JP1977-42114A (JP-552-42114A). As a corona treatment device, a solid-state corona treatment machine, a LEPEL type surface treatment machine, a VETAPHON type treatment machine, or the like (manufactured by Pillar Corporation) can be used. The treatment can be carried out in air under normal pressure. The size of a gap transparent lance between an electrode and a dielectric roll is in a range of 0.1 mm to 10 mm and more preferably in a range of 1.0 mm to 2.0 mm. The discharge is treated above a dielectric support roller provided in ae discharge band, and the treatment amount thereof is in a range of 10 W·min/$m^2$ to 1000 W·min/$m^2$, preferably in a range of 20 W·min/$m^2$ to 500 W·min/$m^2$, and more preferably in a range of 30 W·min/$m^2$ to 250 W·min/$m^2$.

[Liquid Crystal Layer Forming Step]

The liquid crystal layer forming step in the present production method is a step of bringing the liquid crystal composition containing a liquid crystal compound and a solvent into contact with the surface subjected to the surface treatment to form a liquid crystal layer.

A method of bringing the liquid crystal composition into contact with the surface is not particularly limited, and various known methods such as coating can be used.

Here, from the viewpoint of controlling the infiltration layer described above, it is preferable that the solvent is a solvent that does not have a dissolving ability and a swelling ability with respect to the polymer film. The solvent that does not have a dissolving ability and a swelling ability with respect to the polymer film denotes a solvent having low compatibility with the polymer film, and a proper solvent can be used according to the dissolving ability and the swelling ability with respect to the polymer film.

Further, a solvent having a dissolving ability with respect to a cycloolefin-based polymer film denotes a solvent in which the peak area of a polymer film component is 400 my/sec or greater in a case where a polymer film with a size of 24 mm×36 mm (thickness of 80 μm) is immersed in a 15 $cm^3$ bottle containing the solvent at room temperature (25° C.) for 60 seconds and taken out, and the solvent in which the polymer film has been immersed is analyzed by gel permeation chromatography (GPC).

A solvent having a swelling ability with respect to a cycloolefin-based polymer film denotes a solvent in which bending or deformation of a film is found in a case where a polymer film having a size of 24 mm×36 mm (thickness of 80 μm) is vertically placed in a 15 $cm^3$ bottle containing the solvent and immersed therein at 25° C. for 60 seconds, and the solvent is observed while the bottle is appropriately shaken. The polymer film is observed by being bent or deformed due to a change in dimensions of the swollen portion. A change such as bending or deformation is not observed in a solvent having no swelling ability.

Examples of the solvent preferably used include methanol, ethanol, cyclohexanone, acetone, methyl isobutyl ketone, methyl acetate, propylene glycol monomethyl ether, propylene glycol monomethyl ether acetate, and toluene. The solvents can be used alone or in combination of two or more kinds thereof.

Meanwhile, whether or not the solvent has a dissolving ability or a swelling ability with respect to the cycloolefin-based polymer film depends not only on a combination of the component of the polymer film and the solvent but also on the production method in a case of producing the cycloolefin-based polymer film, and thus it is preferable that a solvent is selected according to the cycloolefin-based polymer film. An ester-based solvent such as methyl acetate and an ether-based solvent such as propylene glycol monomethyl ether can be preferably used from the viewpoint that the balance between the dissolving ability or the swelling ability with respect to the cycloolefin-based polymer film and the dissolution stability of the liquid crystal compound is excellent.

[2] Polarizer

The polarizer of the optical laminate according to the embodiment of the present invention is not particularly limited as long as the polarizer is a so-called linear polarizer having a function of converting natural light into specific linear polarized light. The polarizer is not particularly limited, and an absorption type polarizer can be used.

The material of the polarizer used in the present invention is not particularly limited, and a commonly used polarizer can be used. For example, any of an iodine-based polarizer, a dye-based polarizer formed of a dichroic dye, and a polyene-based polarizer can be used.

In the present invention, the thickness of the polarizer is not particularly limited, but is preferably in a range of 3 μm to 60 μm, more preferably in a range of 5 μm to 30 μm, and still more preferably in a range of 5 μm to 15 μm.

An adhesive can be used for laminating the polarizer and the retardation film.

The thickness of the adhesive layer between the polarizer and the polarizing plate protective film on each of both surfaces of the polarizer is set to preferably approximately in a range of 0.01 to 30 more preferably in a range of 0.01 to 10 and still more preferably in a range of 0.05 to 5 In a case where the thickness of the adhesive layer is in the above-described ranges, floating or peeling does not occur between the retardation film and the polarizer to be laminated and an adhesive force having no problem in practical use can be obtained.

As one preferable adhesive, a water-based adhesive, that is, an adhesive in which an adhesive component is dissolved or dispersed in water can be exemplified, and an adhesive formed of a polyvinyl alcohol-based resin aqueous solution is preferably used. In an adhesive formed of a polyvinyl alcohol-based resin aqueous solution, examples of the polyvinyl alcohol-based resin include a vinyl alcohol homopolymer obtained by performing a saponification treatment on polyvinyl acetate, which is a homopolymer of vinyl acetate, a vinyl alcohol-based copolymer obtained by performing a saponification treatment on a copolymer of vinyl acetate and another monomer which can be copolymerized with this vinyl acetate, and a modified polyvinyl alcohol-based copolymer in which a hydroxyl group thereof is partially modified. A polyvalent aldehyde, a water-soluble epoxy compound, a melamine-based compound, a zirconia compound, a zinc compound, a glyoxylate, or the like may be added to the adhesive as a crosslinking agent. In a case where a water-based adhesive is used, the film thickness of the adhesive layer obtained therefrom is typically 1 μm or less.

Preferred examples of other adhesives include a curable adhesive composition containing a cationically polymerizable compound, which is cured by being heated or irradiated with active energy rays, and a curable adhesive composition containing a radically polymerizable compound. Examples of the cationic polymerizable compound include a compound containing an epoxy group or an oxetanyl group. The epoxy compound is not particularly limited as long as the compound contains at least two epoxy groups in a molecule, and examples thereof include compounds described in detail in JP2004-245925A.

The radically polymerizable compound is not particularly limited as long as the radically polymerizable compound has an unsaturated double bond such as a (meth)acryloyl group or a vinyl group, and examples thereof include a monofunctional radically polymerizable compound, a polyfunctional radically polymerizable compound containing two or more polymerizable groups in a molecule, (meth)acrylate containing a hydroxyl group, acrylamide, and acryloyl morpholine. Further, these compounds may be used alone or in combination. For example, compounds described in detail in JP2015-11094A can be used. Further, a radically polymerizable compound and a cationic polymerizable compound can also be used in combination.

In a case where a curable adhesive is used, the film is bonded using a bonding roller, dried as necessary, and irradiated or heated with active energy rays so that the curable adhesive is cured. The light source of the active energy rays Is not particularly limited, but active energy rays having a light emission distribution at a wavelength of 400 nm or less are preferable, and specific preferred examples thereof include a low-pressure mercury lamp, a medium-pressure mercury lamp, a high-pressure mercury lamp, an ultrahigh-pressure mercury lamp, a chemical lamp, a black light lamp, a microwave-excited mercury lamp, and a metal halide lamp.

Further, in a case where the retardation film (protective film) and the polarizer are bonded to each other with an adhesive, the surface of the retardation film opposite to the polarizer may be subjected to a surface treatment (such as a glow discharge treatment, a corona discharge treatment, or an ultraviolet (UV) treatment) or an easy adhesion layer or the like may be formed on the surface for the purpose of improving the adhesive strength and improving the wettability of the adhesive to the surface of the retardation film. The materials and the forming methods of the easy adhesion layer described in JP2007-127893A can be used.

In a case where the retardation film on the liquid crystal layer side and the polarizer are bonded to each other with an adhesive consisting of a polyvinyl alcohol-based resin aqueous solution, it is preferable that the adhesion strength is improved by adding an additive having a high affinity for polyvinyl alcohol to the liquid crystal layer.

Further, in a case where the retardation film on the liquid crystal layer side and the polarizer are bonded to each other with an adhesive cured by being heated or irradiated with active energy rays, it is preferable that the surface of the liquid crystal layer is subjected to a glow discharge treatment or a corona discharge treatment from the viewpoint of improving the adhesion strength and improving the wettability of the adhesive to the surface of the retardation film. Further, a retardation film is prepared in a state where the liquid crystal layer is half-cured, and the liquid crystal layer is fully cured by being heated or irradiated with active energy rays in a case where the retardation film and the polarizer are adhesively bonded to each other, and thus high adhesiveness can be obtained.

[3] Protective Layer

As described above, the optical laminate according to the embodiment of the present invention includes a protective layer on at least one side of the polarizer.

Here, the material of the protective layer Is not particularly limited, and examples thereof include a cellulose acylate film (such as a cellulose triacetate film, a cellulose diacetate film, a cellulose acetate butyrate film, or a cellulose acetate propionate film), a polyacrylic resin film such as polymethyl methacrylate, polyolefin such as polyethylene or polypropylene, a polyester-based resin film such as polyethylene terephthalate or polyethylene naphthalate, a polyether sulfone film, a polyurethane-based resin film, a polyester film, a polycarbonate film, a polysulfone film, a polyether film, a polymethylpentene film, a polyether ketone film, a (meth)acrylonitrile film, polyolefin, and a polymer having an alicyclic structure (Norbornene-based resin (Arton: trade name, manufactured by JSR Corporation), amorphous polyolefin (Zeonex: trade name, manufactured by Zeon Corporation)).

As the optical characteristics of the protective layer, in a case where a protective layer is used between the optical laminate according to the embodiment of the present invention and the other polarizer that sandwiches the liquid crystal cell, a low retardation film satisfying Expressions (8) and (9) is preferable from the viewpoint of improving the display performance.

$$0\ \text{nm} \le Re3(550) \le 10\ \text{nm} \qquad \text{Expression (8):}$$

$$-40\ \text{nm} \le Rth3(550) \le 40\ \text{nm} \qquad \text{Expression (9):}$$

In addition, the film may be disposed between the polarizer and the protective layer via a pressure sensitive adhesive or an adhesive.

[4] Pressure Sensitive Adhesive Layer

The optical laminate according to the embodiment of the present invention includes a pressure sensitive adhesive layer.

Examples of the pressure sensitive adhesive contained in the pressure sensitive adhesive layer include a rubber-based pressure sensitive adhesive, an acrylic pressure sensitive adhesive, a silicone-based pressure sensitive adhesive, a urethane-based pressure sensitive adhesive, a vinyl alkyl ether-based pressure sensitive adhesive, a polyvinyl alcohol-based pressure sensitive adhesive, a polyvinylpyrrolidone-based pressure sensitive adhesive, a polyacrylamide-based pressure sensitive adhesive, and a cellulose-based pressure sensitive adhesive.

Among these, an acrylic pressure sensitive adhesive (pressure sensitive adhesive) is preferable from the viewpoints of the transparency, the weather fastness, the heat resistance, and the like.

As the acrylic pressure sensitive adhesive, a (meth)acrylic polymer is used and typically contains, as a main component, alkyl (meth)acrylate as a monomer unit.

Examples of the alkyl (meth)acrylate constituting the main skeleton of the (meth)acrylic polymer include a linear or branched alkyl group having 1 to 18 carbon atoms. These can be used alone or in combination. The average number of carbon atoms of these alkyl groups is preferably in a range of 3 to 9. In addition, alkyl (meth)acrylate having an aromatic ring, such as phenoxyethyl (meth)acrylate or benzyl (meth)acrylate, can be used. The alkyl (meth)acrylate having an aromatic ring may be used by mixing a polymer obtained by polymerizing the alkyl (meth)acrylate with the (meth)acrylic polymer exemplified above or by copolymerizing the polymer with the alkyl (meth)acrylate. From the viewpoint of transparency, copolymerization is preferable.

The details of the pressure sensitive adhesive are described in, for example, paragraphs to [0084] of JP2018-60014A. The description of the document is incorporated in the present specification by reference.

In the present invention, from the viewpoint that the durability is further enhanced, the residual amount of the (meth)acrylic acid ester-based monomer having a cyclic structure in the pressure sensitive adhesive layer is preferably 100 ppm or less.

A method of forming the pressure sensitive adhesive layer is not particularly limited, and the pressure sensitive adhesive layer can be formed by, for example, a method of coating a release sheet with a solution of a pressure sensitive adhesive, drying the solution, and transferring the sheet to a surface of a transparent resin layer or a method of directly coating a surface of a transparent polymer layer with a solution of a pressure sensitive adhesive and drying the solution.

A solution of a pressure sensitive adhesive is, for example, prepared as a 10 to 40 mass % solution obtained by dissolving or dispersing the pressure sensitive adhesive in a solvent such as toluene or ethyl acetate.

As a coating method, a roll coating method such as reverse coating or gravure coating, a spin coating method, a screen coating method, a fountain coating method, a dipping method, or a spraying method can be employed.

However, from the viewpoint of suppressing chemical cracks of the cycloolefin-based polymer, it is preferable to dry the above-described solvent so as not to remain.

Examples of the constituent material of the release sheet include appropriate thin paper bodies, for example, synthetic polymer films such as polyethylene, polypropylene, and polyethylene terephthalate, rubber sheets, paper, cloth, non-woven fabrics, nets, foam sheets, and metal foils.

The thickness of the pressure sensitive adhesive layer is not particularly limited, but is preferably in a range of 3 μm to 50 μm, more preferably in a range of 4 μm to 50 μm, still more preferably in a range of 5 μm to 50 μm, and particularly preferably in a range of 5 μm to 30 μm from the viewpoint of further enhancing the durability.

Further, from the viewpoint of further enhancing the durability, the storage elastic modulus of the pressure sensitive adhesive layer is preferably 0.18 MPa or greater, more preferably 0.45 MPa or greater, and still more preferably 2.2 MPa or greater. Further, from the viewpoint of peeling properties, the storage elastic modulus of the pressure sensitive adhesive layer is preferably 5 MPa or less.

Here, the storage elastic modulus of the pressure sensitive adhesive layer denotes a value measured by a tensile tester using the following method after the pressure sensitive adhesive is laminated.

In the measurement, a plurality of pressure sensitive adhesive tapes are laminated and bonded to each other, and an autoclave is carried out at 60° C. and 0.5 MPa for 30 minutes, thereby preparing a sample for a dynamic viscoelasticity test with a thickness of 1 mm.

This sample is subjected to a dynamic viscoelasticity test in a linear region under a condition of a frequency of 1 Hz using a tensile tester (shear type rheometer (device name: MCR301, manufactured by Anton Paar GmbH)).

Next, the storage elastic modulus is measured by reading a value at 30° C. under conditions of a temperature increasing rate of 3° C./min in a temperature range of −40° C. to +150° C.

In the present invention, from the viewpoint of enhancing the durability, the amount of the organic low-molecular-weight component (molecular weight of 32 to 200) constituting the pressure sensitive adhesive in the result obtained by investigating volatile components such as solvents according to component analysis performed on the pressure sensitive adhesive layer using a headspace gas chromatograph mass spectrometer (hereinafter, also referred to as "HS-GCMS") is preferably 2,000 ppm or less, more preferably 1,000 ppm or less, still more preferably 500 ppm or less, and particularly preferably 100 ppm or less.

Further, in a case where a durability test is conducted at 115° C. for 100 hours in a state where the optical laminate according to the embodiment of the present invention is adhered to a glass substrate via the pressure sensitive adhesive layer, and the amount of the organic low-molecular-weight component (molecular weight of 32 to 200) is 500 ppm or less in the measurement of the pressure sensitive adhesive layer after the durability test using HS-GCMS, the durability is further enhanced.

The conditions for HS-GCMS are as follows.

Heat insulation temperature: 200° C., heat insulation time: 20 min, injection time: 0.5 min Column: DB-624UI (30 m, 0.25 mm, 1.4 um)

Temperature: 35° C. (1 min), 10° C./min→250° C. (15 min)

Flow rate: 1.5 mL/min, linear velocity: 44.0 cm/sec, Split: 5:1

[5] Interlayer

In a case where Condition I is satisfied, the optical laminate according to the embodiment of the present invention includes an interlayer between the retardation layer and the pressure sensitive adhesive layer described above.

An organic interlayer or an inorganic interlayer that is in direct contact with the above-described retardation layer is preferable as the interlayer.

Further, an organic interlayer provided between the retardation layer and the pressure sensitive adhesive layer described above via an adhesive or a pressure sensitive adhesive is preferable, and a polymer film is more preferable as the interlayer.

In the present invention, it is preferable that the interlayer is transparent. In the present specification, "transparency" denotes that the transmittance of visible light is 60% or greater, and in the present invention, the transmittance is preferably 80% or greater and more preferably 90% or greater.

[5-1] Interlayer (Direct Lamination Organic Interlayer)

The organic Interlayer that Is In direct contact with the above-described retardation layer (hereinafter, also referred to as "directly laminated organic interlayer") is not particularly limited as long as the interlayer shields or absorbs the organic low-molecular-weight component (volatile component) of the pressure sensitive adhesive layer so that the component does not reach the retardation layer, and various known interlayers can be used.

Examples of the directly laminated organic interlayer include a layer obtained by curing a composition containing a polyfunctional monomer and a layer obtained by curing a composition that contains a polymer containing a functional group.

In addition, other examples of the directly laminated organic interlayer include a layer formed of a polymer with no polymerization reactivity, which is simply dried and solidified (hereinafter, also referred to as "polymer binder"). Examples of such a polymer binder include an epoxy polymer, a diallyl phthalate polymer, a silicone polymer, a phenol polymer, an unsaturated polyester polymer, a polyimide polymer, a polyurethane polymer, a melamine polymer, a urea polymer, an ionomer polymer, an ethylene ethyl acrylate polymer, an acrylonitrile acrylate styrene copolymerized polymer, an acrylonitrile styrene polymer, an acrylonitrile chloride polyethylene styrene copolymerized polymer, an ethylene vinyl acetate polymer, an ethylene vinyl alcohol copolymerized polymer, an acrylonitrile butadiene styrene copolymerized polymer, a vinyl chloride polymer, a chlorinated polyethylene polymer, a polyvinylidene chloride polymer, a cellulose acetate polymer, a fluoropolymer, a polyoxymethylene polymer, a polyamide polymer, a polyarylate polymer, a thermoplastic polyurethane elastomer, a polyether ether ketone polymer, a polyether sulfone polymer, polyethylene, polypropylene, a polycarbonate polymer, polystyrene, a polystyrene maleic acid copolymerized polymer, a polystyrene acrylic acid copolymerized polymer, a polyphenylene ether polymer, a polyphenylene sulfide polymer, a polybutadiene polymer, a polybutylene terephthalate polymer, an acrylic polymer, a methacrylic polymer, a methylpentene polymer, polylactic acid, a polybutylene succinate polymer, a butyral polymer, a formal polymer, polyvinyl alcohol, polyvinylpyrrolidone, ethyl cellulose, carboxymethyl cellulose, gelatin, and copolymerized polymers thereof.

The function of such a direct laminated organic interlayer is not particularly limited, and for example, a layer having a function such as a stress relaxation layer, a protective layer, an alignment layer, a flattening layer, or a refractive index adjusting layer may be used.

The thickness of the directly laminated organic interlayer is not particularly limited, but is preferably in a range of 0.01 to 50 more preferably in a range of 0.1 to 30 still more preferably greater than 0.2 μm and 10 μm or less, and particularly preferably in a range of 0.5 to 5

[5-2] Interlayer (Direct Lamination Inorganic Interlayer)

The inorganic interlayer that is in direct contact with the above-described retardation layer (hereinafter, also referred to as "directly laminated inorganic interlayer") is not particularly limited as long as the interlayer shields the organic low-molecular-weight component (volatile component) of the pressure sensitive adhesive layer so that the component does not reach the retardation layer, and various known interlayers such as an oxygen-shielding layer can be used.

Here, as the directly laminated inorganic interlayer, a thin layer consisting of a metal compound (metal compound thin layer) may be used as long as the layer is transparent.

As a method of forming the metal compound thin layer, any method can be used as long as a desired thin layer can be formed. Suitable examples thereof include a sputtering method, a vacuum deposition method, an ion plating method, and a plasma chemical vapor deposition (CVD) method. Specifically, the forming methods described in JP3400324B, JP2002-322561A, and JP2002-361774A can be employed.

The component contained in the metal compound thin layer is not particularly limited as long as the component can exhibit an oxygen shielding function, and an oxide, a nitride, an oxynitride, or the like containing one or more metals selected from Si, Al, In, Sn, Zn, Ti, Cu, Ce, Ta and the like can be used. Among these, an oxide, a nitride, or an oxynitride of a metal selected from Si, Al, In, Sn, Zn, and Ti is preferable, and an oxide, a nitride, or an oxynitride of a metal selected from Si, Al, Sn, and Ti is particularly preferable. These may contain other elements as secondary components.

Further, the oxygen-shielding layer serving as the directly laminated inorganic interlayer may be in the form of lamination of the layer containing an organic material and the metal compound thin layer as described in, for example, U.S. Pat. No. 6,413,645B, JP2015-226995A, JP2013-202971A, JP2003-335880A, JP1978-12953B (JP-553-12953B), and JP1983-217344A (JP-558-217344A) and may be a layer obtained by hybridizing an organic compound and an inorganic compound as described in WO2011/11836A, JP2013-248832A, and JP3855004B.

The thickness of the directly laminated inorganic interlayer is not particularly limited, but is preferably in a range of 0.01 to 10 μm, more preferably in a range of 0.05 to 5 μm, and still more preferably in a range of 0.1 to 2 μm.

[5-3] Organic Interlayer

The organic interlayer provided between the retardation layer and the pressure sensitive adhesive layer described above via an adhesive or a pressure sensitive adhesive is not particularly limited, and a commonly used polymer film (for example, a protective film of a polarizer) can be used.

Specific examples of the polymer constituting the polymer film include a cellulose-based polymer, an acrylic polymer containing an acrylic acid ester polymer such as polymethyl methacrylate or a lactone ring-containing polymer, a thermoplastic norbornene-based polymer, a polycarbonate-based polymer, a polyester-based polymer such as polyethylene terephthalate or polyethylene naphthalate, a styrene-based polymer such as polystyrene or an acrylonitrile-styrene copolymer (AS resin), a polyolefin-based polymer such as polyethylene, polypropylene, or an ethylene-propylene copolymer, a vinyl chloride-based polymer, an amide-based polymer such as nylon or aromatic polyamide, an imide-based polymer, a sulfone-based polymer, a polyether sulfone-based polymer, a polyether ether ketone-based polymer, a polyphenylene sulfide-based polymer, a vinylidene chloride-based polymer, a vinyl alcohol-based polymer, a vinyl butyral-based polymer, an arylate-based polymer, a polyoxymethylene-based polymer, an epoxy-based polymer, and a polymer obtained by mixing such polymers.

Further, from the viewpoints of the workability and the optical performance, it is preferable to use at least one selected from the group consisting of a cycloolefin-based polymer, an acrylic polymer, a polycarbonate-based polymer, and a cellulose-based polymer as the polymer constituting the polymer film.

Examples of the acrylic polymer include polymethyl methacrylate and the lactone ring-containing polymer and the like described in paragraphs [0017] to [0107] of JP2009-98605A.

Further, in the present invention, it is preferable that the polymer film is transparent.

From the viewpoint that the effects of the present invention are more excellent, the thickness d of the polymer film is preferably 0.5 μm or greater and more preferably 1 μm or greater. In addition, the thickness d of the polymer film is preferably 50 μm or less, more preferably 30 μm or less, still more preferably 20 μm or less, and particularly preferably 10 μm or less in consideration of the bending performance of the polarizing plate, and the thickness d thereof can be set to be in a range of 5 to 10 μm in consideration of the manufacturability or the like of the film.

The above-described interlayer of the optical laminate according to the embodiment of the present invention may have optical anisotropy. For example, an interlayer may be provided between the retardation layer and the pressure sensitive adhesive layer via a pressure sensitive adhesive having a thickness of 10 μm or less, and the interlayer itself may have optical anisotropy (optical retardation).

In a case where the optical laminate according to the embodiment of the present invention includes the above-described interlayer, the in-plane retardation Re1 (550) and the thickness direction retardation Rth1 (550) of the entirety of the retardation layer and the interlayer at a wavelength of 550 nm respectively satisfy preferably Expression (1) and Expression (2), more preferably Expression (1-1) and Expression (2-1), and still more preferably Expression (1-2) and Expression (2-2).

$$0\ \text{nm} \leq Re1(550) \leq 350\ \text{nm} \qquad \text{Expression (1):}$$

$$-200\ \text{nm} \leq Rth1(550) \leq 200\ \text{nm}. \qquad \text{Expression (2):}$$

$$60\ \text{nm} \leq Re1(550) \leq 300\ \text{nm} \qquad \text{Expression (1-1):}$$

$$-100\ \text{nm} \leq Rth1(550) \leq 100\ \text{nm} \qquad \text{Expression (2-1):}$$

$$80\ \text{nm} \leq Re1(550) \leq 160\ \text{nm} \qquad \text{Expression (1-2):}$$

$$-80\ \text{nm} \leq Rth1(550) \leq 20\ \text{nm} \qquad \text{Expression (2-2):}$$

[II] Image Display Device

An image display device according to the embodiment of the present invention includes the above-described optical laminate according to the embodiment of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and an organic EL display panel is more preferable. That is, in the image display device according to the embodiment of the present invention, a liquid crystal display device obtained by using a liquid crystal cell as a display element or an organic EL display device obtained by using an organic EL display panel as a display element is preferable, and an organic EL display device is more preferable.

[1] Liquid Crystal Display Device

A liquid crystal display device which is an example of the image display device according to the embodiment of the present invention is a liquid crystal display device that includes the above-described optical laminate according to the embodiment of the present invention (but does not include a λ/4 plate) and a liquid crystal cell.

In the present invention, between the optical laminates provided on both sides of the liquid crystal cell, it is preferable that the optical laminate according to the embodiment of the present invention is used as a front-side (viewing side) polarizer and more preferable that the optical laminate according to the embodiment of the present invention is used as a front-side polarizer and a rear-side polarizer.

Hereinafter, the liquid crystal cell constituting the liquid crystal display device will be described in detail.

(Liquid Crystal Cell)

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules (rod-like liquid crystal compound) are substantially horizontally aligned in a case of no voltage application and further twistedly aligned at 60° to 120°. The liquid crystal cell in a TN mode is most frequently used as a color TFT liquid crystal display device and is described in a plurality of documents.

In the liquid crystal cell in a VA mode, rod-like liquid crystal molecules are substantially vertically aligned at the time of no voltage application. The concept of the liquid crystal cell in a VA mode includes (1) liquid crystal cell in a VA mode in a narrow sense where rod-like liquid crystal molecules are aligned substantially vertically in a case of no voltage application and substantially horizontally in a case of voltage application (described in JP1990-176625A (JP-H2-176625A)), (2) liquid crystal cell (in a multi-domain vertical alignment (MVA) mode) (SID97, described in Digest of tech. Papers (proceedings) 28 (1997) 845) in which the VA mode is formed to have multi-domain in order to expand the viewing angle, (3) liquid crystal cell in an axially symmetric aligned microcell (n-ASM) mode in which rod-like liquid crystal molecules are substantially vertically aligned in a case of no voltage application and twistedly multi-domain aligned in a case of voltage application (described in proceedings of Japanese Liquid Crystal Conference, pp. 58 to 59 (1998)), and (4) liquid crystal cell in a SURVIVAL mode (presented at LCD International 98). Further, the liquid crystal cell may be of any of a patterned vertical alignment (PVA) type, a photo-alignment (optical alignment) type, or a polymer-sustained alignment (PSA) type. The details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

In the present invention, the IPS mode is most preferable from the viewpoint of viewing angle performance.

[2] Organic EL Display Device

As an organic EL display device which is an example of the image display device according to the embodiment of the present invention, an embodiment of a display device including the above-described optical laminate (here, including a pressure sensitive adhesive layer and a λ/4 plate) according to the embodiment of the present invention and an organic EL display panel in order from the viewing side is suitably exemplified.

Further, the organic EL display panel is a display panel formed of an organic EL element having an organic light emitting layer (organic electroluminescence layer) sandwiched between electrodes (between a cathode and an anode). The configuration of the organic EL display panel is not particularly limited, and a known configuration is employed.

Further, it is still more preferable to use a liquid crystal compound having reciprocal wavelength dispersibility as the λ/4 plate having excellent optical performance. Specifically, the liquid crystal compound represented by General Formula (II) described in WO2017/043438A is preferably used. In regard to a method of preparing the λ/4 plate formed of a liquid crystal compound having reciprocal wavelength dispersibility, the description of Examples 1 to 10 of WO2017/043438A and Example 1 of JP2016-91022A can be referred to.

EXAMPLES

Hereinafter, the present invention will be described in detail based on examples. The materials, the reagents, the amounts of materials, and the proportions of the materials, the operations, and the like shown in the following examples can be appropriately changed within a range not departing from the gist of the present invention. Therefore, the present invention is not limited to the following examples.

<Preparation of Retardation Film>

One surface of a cycloolefin-based polymer film (Arton resin film, manufactured by JSR Corporation, Re=125 nm, Rth=63 nm, film thickness=25 μm) was subjected to a corona treatment at a discharge amount of 125 W·min/m$^2$.

Next, the surface that had been subjected to a corona treatment was coated with a composition 1 for forming a liquid crystal layer prepared with the following composition using a die coating method.

Next, in order to dry the solvent of the composition and to align and mature the liquid crystal compound, the coating layer was cured by being heated with hot air at 70° C. for 120 seconds and being irradiated with ultraviolet rays at 300 mJ/cm$^2$, thereby forming an optically anisotropic layer (liquid crystal layer). The prepared retardation film had a Re of 124 nm and a Rth of −28 nm.

In the following description, the liquid crystal layer included in the prepared retardation film will be referred to as “first retardation layer”, and the cycloolefin-based polymer film will also be referred to as “second retardation layer”.

The cycloolefin-based polymer film used in the present invention is optically a positive A-plate having an Nz coefficient of approximately 1, and in a case where in-plane refractive indices in the slow axis direction and in the fast axis direction are respectively defined as nx and ny and the refractive index in the thickness direction is defined as nz, a relationship of “nx>ny=nz” is satisfied. The in-plane retardation Re and the Nz coefficient satisfy the following relationships.

$$Re=(nx-ny)\times d$$

$$Nz=(nx-nz)/(nx-ny)$$

However, d represents the thickness.

In the present invention, the description of “ny=nz” in the positive A-plate does not necessarily mean that the in-plane refractive index ny and the thickness direction refractive index nz completely match each other.

Therefore, in a case where the Nz coefficient is in a range of 0.90 to 1.10, the positive A-plate of the present invention may be considered to satisfy Nz=1.0 of ny=nz, and the Nz coefficient is preferably in a range of 0.95 to 1.05.

Composition 1 for Forming Liquid Crystal Layer

Liquid crystal compound R1 shown below: 100.0 parts by mass

Alignment assistant (A1) shown below: 1.5 parts by mass

Compound B1 represented by Formula (I): 3.0 parts by mass

ATMMT: 5.0 parts by mass (pentaerythritol tetraacrylate, manufactured by Shin-Nakamura Chemical Co., Ltd.)

Polymerization initiator (P1) shown below: 2.0 parts by mass

Polymerization initiator (P2) shown below: 5.0 parts by mass

Surfactant (S1) shown below: 0.3 parts by mass

Surfactant (S2) shown below: 0.5 parts by mass

Acetone: 425.6 parts by mass

Propylene glycol monomethyl ether acetate: 48.9 parts by mass

Methanol: 14.7 parts by mass

Liquid Crystal Compound R1

Mixture of liquid crystal compounds (RA), (RB), and (RC) shown below at mass ratio of 83:15:2

(RA)
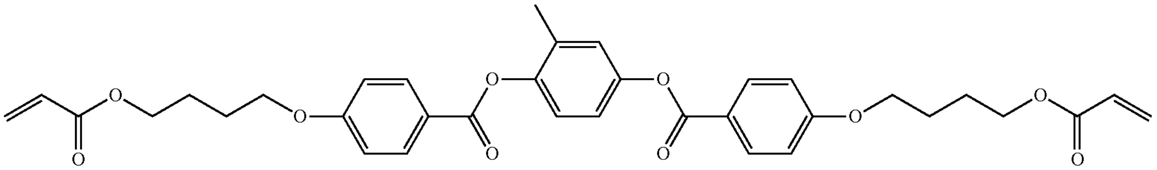
(RB)
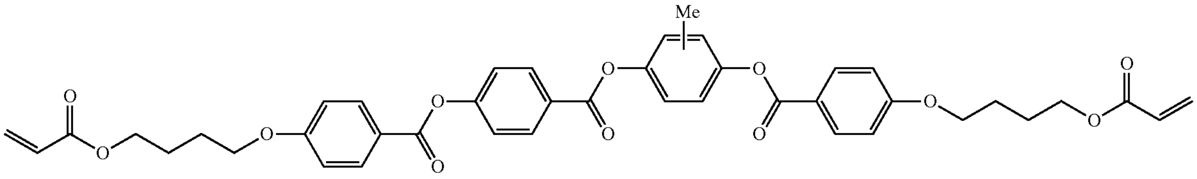
(RC)
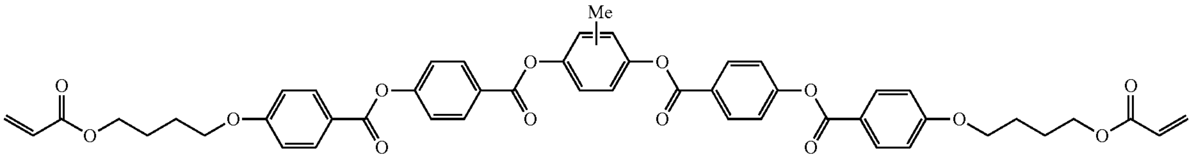
Alignment aid A1
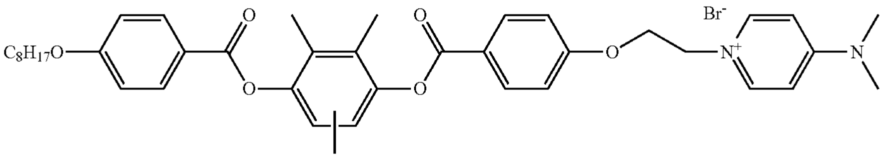
Compound B1 represented by Formula (I)
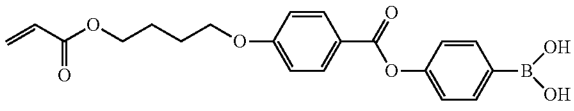 [SMILES: C=CC(=O)OCCCCOc1ccc(C(=O)Oc2ccc(B(O)O)cc2)cc1]
Polymerization initiator (P1): OXE-01 (manufactured by BASF)
Polymerization initiator (P2): Omnirad 127 (manufactured by IGM Resins B. V.)
Surfactant S1 (weight-average molecular weight: 15,000, numerical values in structures shown below are in units of % by mass)
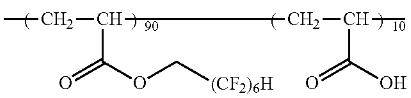
Surfactant S2 (weight-average molecular weight: 11,200)
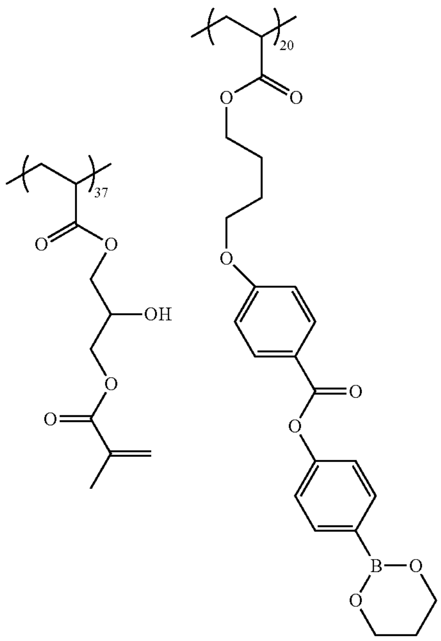

-continued

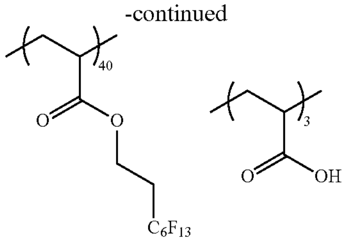

<Preparation of Protective Film>

[Preparation of Core Layer Cellulose Acylate Dope 1]

The following composition was put into a mixing tank and stirred to dissolve each component, thereby preparing a core layer cellulose acylate dope 1.

Core Layer Cellulose Acylate Dope 1

Cellulose acetate having acetyl substitution degree of 2.88: 100 parts by mass
Ester oligomer A shown below: 10 parts by mass
Polarizer durability improving agent shown below: 4 parts by mass
Ultraviolet absorbing agent shown below: 2 parts by mass
Methylene chloride (first solvent): 430 parts by mass
Methanol (second solvent): 64 parts by mass
Ester oligomer A (weight-average molecular weight: 750)

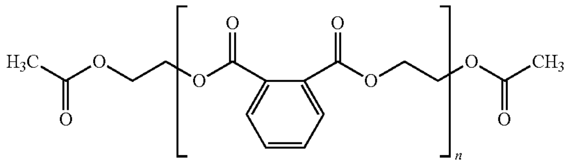

Polarizer durability improving agent

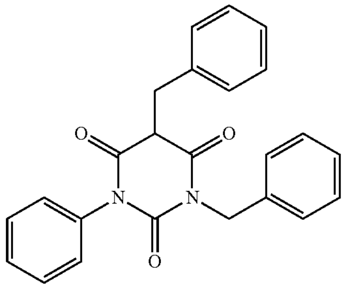 [SMILES: O=C1C(Cc2ccccc2)C(=O)N(c2ccccc2)C(=O)N1Cc1ccccc1]

UV absorbing agent

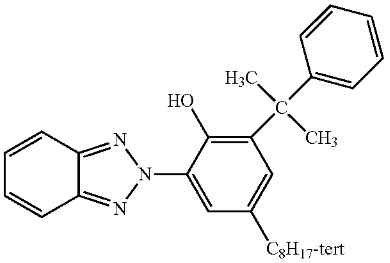

[Preparation of Outer Layer Cellulose Acylate Dope 1]

10 parts by mass of the following matting agent solution was added to 90 parts by mass of the above-described core layer cellulose acylate dope 1, thereby preparing an outer layer cellulose acylate dope 1.

Outer Layer Cellulose Acylate Dope 1

Silica particles with average particle size of 20 nm (AEROSIL R972, manufactured by Nippon Aerosil Co., Ltd.): 2 parts by mass
Methylene chloride (first solvent): 76 parts by mass
Methanol (second solvent): 11 parts by mass
Core layer cellulose acylate dope 1: 1 part by mass

[Preparation of Cellulose Acylate Film 1]

Three layers which were the above-described core layer cellulose acylate dope 1 and the outer layer cellulose acylate dopes 1 provided on both sides of the core layer cellulose acylate dope 1 were simultaneously cast from a casting port onto a drum at 20° C. Next, the film was peeled off in a state where the solvent content was approximately 20% by mass, both ends of the film in the width direction were fixed by tenter clips, and the film was dried while being stretched at a stretching ratio of 1.1 times in the lateral direction in a state where the residual solvent was in a range of 3% to 15%. Thereafter, the film was further dried by being transported between rolls of a heat treatment device to prepare a cellulose acylate film 1 having a thickness of 40 and the film was used as a protective film 100. As a result of measuring the retardation of the protective film 100, Re was 2 nm and Rth was 7 nm.

<Preparation of Low Retardation Film>

[Preparation of Core Layer Cellulose Acylate Dope 2]

The following composition was put into a mixing tank and stirred to dissolve each component, thereby preparing a core layer cellulose acylate dope 2.

Core Layer Cellulose Acylate Dope 2

Cellulose acetate having acetyl substitution degree of 2.88: 100 parts by mass
Polyester shown below: 12 parts by mass
Polarizer durability improving agent shown above: 4 parts by mass
Methylene chloride (first solvent): 430 parts by mass
Methanol (second solvent): 64 parts by mass
Polyester (number average molecular weight of 800)

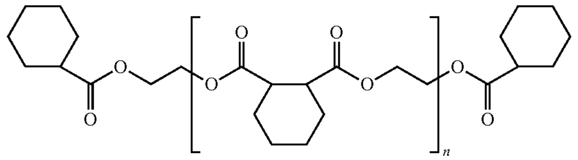

[Preparation of Outer Layer Cellulose Acylate Dope 2]

10 parts by mass of the following matting agent solution was added to 90 parts by mass of the above-described core layer cellulose acylate dope 2, thereby preparing an outer layer cellulose acylate dope 2.

Matting Agent Solution

Silica particles with average particle size of 20 nm (AEROSIL R972, manufactured by Nippon Aerosil Co., Ltd.): 2 parts by mass
Methylene chloride (first solvent): 76 parts by mass
Methanol (second solvent): 11 parts by mass
Core layer cellulose acylate dope: 1 part by mass

[Preparation of Cellulose Acylate Film 2]

The core layer cellulose acylate dope 2 and the outer layer cellulose acylate dope 2 were filtered through filter paper having an average pore size of 34 μm and a sintered metal filter having an average pore size of 10 and three layers which were the core layer cellulose acylate dope 2 and the outer layer cellulose acylate dopes 2 provided on both sides of the core layer cellulose acylate dope 2 were simultaneously cast from a casting port onto a drum at 20° C. (band casting machine).

Next, the film was peeled off in a state where the solvent content was approximately 20% by mass, both ends of the film in the width direction were fixed by tenter clips, and the film was dried while being stretched at a stretching ratio of 1.1 times in the lateral direction.

Thereafter, the film was further dried by being transported between the rolls of the heat treatment device to prepare a cellulose acylate film 2 having a thickness of 40 μm, and the film was used as a low retardation film 210. As a result of measuring the retardation of the low retardation film 210, Re was 1 nm and Rth was −5 nm.

<Saponification Treatment of Protective Film>

The protective film 100 prepared above was immersed in a 2.3 mol/L sodium hydroxide aqueous solution at 55° C. for 3 minutes. The film was washed in a water washing bath at room temperature and neutralized with 0.05 mol/L sulfuric acid at 30° C. The film was washed again in a water washing bath at room temperature and further dried with hot air at 100° C., and the surface of the protective film was subjected to a saponification treatment.

<Preparation of Polarizing Plate>

The saponified protective film 100 prepared above, a polyvinyl alcohol-based polarizer, and the retardation film prepared above were set such that the absorption axis of the polarizer and the slow axis of the retardation film were in directions parallel to each other, and the retardation film on the liquid crystal layer (first retardation layer) side and the polarizer were bonded with an adhesive, thereby preparing an upper polarizing plate.

A 3% PVA (PVA-117H, manufactured by Kuraray Co., Ltd.) aqueous solution was used as the adhesive.

In addition, a lower polarizing plate was prepared by similarly bonding the saponified protective film, the polyvinyl alcohol-based polarizer, and the saponified protective film 100 prepared above. At this time, the polarizer and the retardation film had sufficient adhesiveness for practical use.

<Preparation of Pressure Sensitive Adhesives I, II, and III>

A pressure sensitive adhesive of an acrylic polymer was prepared according to the following procedures, thereby obtaining pressure sensitive adhesives I, II, and III.

Pressure sensitive adhesive I (organic low-molecular-weight component having molecular weight of 500 or less: 2.6% by mass)

Main agent (SK Dyne SF-2147): 200 g (16% solid content)
Crosslinking agent: 80 mg
Silane coupling agent: 120 mg
AS agent (1-octyl-4-methylpyridinium)=bis(trifluoromethanesulfonyl)imide): 670 mg Pressure sensitive adhesive II (organic low-molecular-weight component having molecular weight of 500 or less: 0.6% by mass)

Main agent (SK Dyne SF-2147): 200 g (16% solid content)
Crosslinking agent: 80 mg
Silane coupling agent: 120 mg Pressure sensitive adhesive III (organic low-molecular-weight component having molecular weight of 500 or less: 5.5% by mass)

Main agent (SK Dyne SF-2147): 200 g (16% solid content)
Crosslinking agent: 80 mg
Silane coupling agent: 120 mg
AS agent (1-octyl-4-methylpyridinium)=bis(trifluoromethanesulfonyl)imide): 1670 mg <Preparation of Pressure Sensitive Adhesive IV>

Next, an acrylic polymer was prepared according to the following procedures. 70 parts by mass of 2-ethylhexyl acrylate, 20 parts by mass of ethyl acrylate, 6 parts by mass of hydroxyethyl methacrylate, 5 parts by mass of benzyl acrylate, and 4 parts by mass of acrylic acid were polymerized by a solution polymerization method in a reaction container equipped with a cooling pipe, a nitrogen introduction pipe, a thermometer, and a stirrer, thereby obtaining a pressure sensitive adhesive IV of the acrylic polymer 1 with an average molecular weight of 250,000.

<Preparation of Pressure Sensitive Adhesive V>

Next, an acrylic polymer was prepared according to the following procedures. 70 parts by mass of 2-ethylhexyl acrylate, 20 parts by mass of ethyl acrylate, 6 parts by mass of hydroxyethyl methacrylate, and 4 parts by mass of acrylic acid were polymerized by a solution polymerization method in a reaction container equipped with a cooling pipe, a nitrogen introduction pipe, a thermometer, and a stirrer, thereby obtaining a pressure sensitive adhesive V of the acrylic polymer with an average molecular weight of 300,000.

<Preparation of Pressure Sensitive Adhesive Sheet>

A pressure sensitive adhesive sheet was prepared using the obtained pressure sensitive adhesives I, II, III, IV, and V according to the following procedures.

Next, a PET film subjected to a surface treatment with a silicone-based release agent was coated with the prepared pressure sensitive adhesive composition using a die coater and dried at 150° C. for 3 hours, thereby preparing a pressure sensitive adhesive having a pressure sensitive adhesive layer with a thickness of 15 The storage elastic modulus of the pressure sensitive adhesive layer was 0.18 MPa.

<Pressure Sensitive Adhesives VI and VII>

An Opteria D692 (thickness: 15 storage elastic modulus: 2.2 MPa, manufactured by Lintec Corporation) was used as the pressure sensitive adhesive VI.

Further, SK1478 (thickness: 25 storage elastic modulus: 0.45 MPa, manufactured by Soken Chemical & Engineering Co., Ltd.) was used as the pressure sensitive adhesive VII.

[Preparation of Optical Laminate of Comparative Example 1]

An optical laminate was prepared by laminating the pressure sensitive adhesive sheet formed of the pressure sensitive adhesive III on the upper polarizing plate prepared above.

Next, as a result of evaluating the durability of the prepared optical laminate, it was confirmed that multiple cracks were generated in the plane of the optical laminate as listed in Table 1.

[Preparation of Optical Laminate of Example 1]

An optical laminate was prepared under the same conditions as in Comparative Example 1 except that the pressure sensitive adhesive I was applied in place of the pressure sensitive adhesive III.

Next, as a result of evaluating the durability of the prepared optical laminate, it was found that cracks in the plane of the optical laminate were reduced as compared with the configuration of Comparative Example 1 as listed in Table 1.

[Preparation of Optical Laminate of Example 2]

An optical laminate was prepared under the same conditions as in Example 1 except that the pressure sensitive adhesive II was applied in place of the pressure sensitive adhesive I.

Next, as a result of evaluating the durability of the prepared optical laminate, it was confirmed that cracks did not occur in the plane of the optical laminate as listed in Table 1. It was found that the reduction of the organic low-molecular-weight component greatly improved the crack resistance of the cycloolefin-based polymer.

[Preparation of Optical Laminate of Comparative Example 2]

An optical laminate was prepared under the same conditions as in Example 1 except that the pressure sensitive adhesive IV was applied in place of the pressure sensitive adhesive I.

Next, as a result of evaluating the durability of the prepared optical laminate, it was confirmed that multiple cracks were generated in the plane of the optical laminate as listed in Table 2.

In addition, as a result of evaluating the content of the organic low-molecular-weight component with a molecular weight of 32 to 200 contained in the pressure sensitive adhesive layer (pressure sensitive adhesive) from the analysis result of HS-GCMS, it was found that the content of the organic low-molecular-weight component with a molecular weight of 32 to 200 (mainly unreacted monomer) was 1,500 ppm and the content of the organic low-molecular-weight component did not change even after the durability test, and thus the large amount of the organic low-molecular-weight component was considered to be the cause of cracks of the cycloolefin-based polymer.

[Preparation of Optical Laminate of Example 3]

An optical laminate was prepared under the same conditions as in Example 1 except that the pressure sensitive adhesive V was applied in place of the pressure sensitive adhesive I.

Next, as a result of evaluating the durability of the prepared optical laminate, it was found that cracks slightly occur in the plane of the optical laminate, but were significantly reduced as listed in Table 2. From this result, it was found that the (meth)acrylic acid ester-based monomer having a cyclic structure, particularly not containing benzyl acrylate (or lower than or equal to the detection limit by HS-GCMS) and a decrease in the content of the organic low-molecular-weight component after the durability test were effective in suppressing cracks of the cycloolefin based on the difference between the pressure sensitive adhesive IV and the pressure sensitive adhesive V.

In particular, it was considered that in a case where benzyl acrylate or the like was contained, the benzyl acrylate was oxidized in the process of the durability test so that low-molecular-weight components such as benzaldehyde and benzoic acid were further generated, and thus the crack resistance was degraded.

[Preparation of Optical Laminate of Example 4]

An optical laminate was prepared under the same conditions as in Example 1 except that the pressure sensitive adhesive VI was applied in place of the pressure sensitive adhesive I.

Next, as a result of evaluating the durability of the prepared optical laminate, it was confirmed that cracks did not occur in the plane of the optical laminate as listed in Table 2.

Further, based on the analysis results of HS-GCMS of the pressure sensitive adhesive layer (pressure sensitive adhesive VI), it was found that in a case where the amount of the organic low-molecular-weight component (molecular weight of 200 or less) containing a (meth)acrylic acid ester-based monomer having a cyclic structure such as benzyl acrylate was small (500 ppm) in the pressure sensitive adhesive VI and the content of the organic low-molecular-weight component was decreased after the durability test, this was greatly effective in suppressing cracks of the cycloolefin.

[Preparation of Optical Laminate of Example 5]

An optical laminate was prepared under the same conditions as in Example 1 except that the pressure sensitive adhesive VII was applied in place of the pressure sensitive adhesive I.

Next, as a result of evaluating the durability of the prepared optical laminate, it was confirmed that cracks did not occur in the plane of the optical laminate as listed in Table 2.

Further, based on the analysis results of HS-GCMS of the pressure sensitive adhesive layer (pressure sensitive adhesive VII), it was found that in a case where the amount of the organic low-molecular-weight component (molecular weight of 200 or less) containing a (meth)acrylic acid ester-based monomer having a cyclic structure was extremely small (50 ppm or less) in the pressure sensitive adhesive VII and the content of the organic low-molecular-weight component was lower than or equal to the detection limit after the durability test, this was greatly effective in suppressing cracks of the cycloolefin.

[Preparation of Optical Laminate of Example 6]

An optical laminate was prepared under the same conditions as in Comparative Example 2 except that the acrylate-based polymer layer 1 (thickness: 2 μm) as the organic interlayer was directly laminated on the surface of the second retardation layer on the pressure sensitive adhesive layer side in the configuration of Comparative Example 2 to which the pressure sensitive adhesive IV had been applied. The layer configuration of the optical laminate is shown in FIG. 3.

Hereinafter, a method for forming the acrylate-based polymer layer 1 will be described.

A surface of a cycloolefin-based polymer film (Arton resin film, manufactured by JSR Corporation, Re=124 nm, Rth=63 nm, film thickness=24 μm) on a side opposite to the liquid crystal layer (first retardation layer) was subjected to a corona treatment at a discharge amount of 125 W·min/$m^2$.

Next, the film was coated with an acrylate-based polymer composition 1 having the following composition using a die coating method.

Next, in order to dry the solvent of the composition, the coating layer was cured by being heated with hot air at 70° C. for 120 seconds and being irradiated with ultraviolet rays at 300 mJ/$cm^2$, thereby forming an acrylate-based polymer layer 1.

Acrylate-Based Polymer Composition 1

- ATMM: 100.0 parts by mass
- Compound B1 represented by Formula (I): 3.0 parts by mass
- Polymerization initiator (P2): 3.0 parts by mass (Omnirad 127, manufactured by IGM Resins B.V.)
- Surfactant (S2) shown above: 0.5 parts by mass
- Acetone: 425.6 parts by mass
- Propylene glycol monomethyl ether acetate: 48.9 parts by mass
- Methanol: 14.7 parts by mass Next, as a result of evaluating the durability of the prepared optical laminate, it was confirmed that cracks in the plane of the optical laminate were reduced as compared with Comparative Example 2 as listed in Table 2.

It was considered that suppression of movement of the low-molecular-weight component of the pressure sensitive adhesive to the cycloolefin side and an increase in rigidity of the cycloolefin-based polymer were effective in suppressing cracks of the cycloolefin. Further, the rigidity here is an index of the elastic modulus x film thickness in terms of mechanical properties.

[Preparation of Optical Laminate of Example 7]

An optical laminate was prepared under the same conditions as in Example 6 except that the acrylate-based polymer layer 2 (thickness: 1 μm) as the organic interlayer was directly laminated on the surface of the second retardation layer on the pressure sensitive adhesive layer side in the configuration of Example 6 to which the pressure sensitive adhesive IV had been applied.

Hereinafter, a method of forming the acrylate-based polymer layer 2 will be described.

A surface of a cycloolefin-based polymer film (Arton resin film, manufactured by JSR Corporation, Re=124 nm, Rth=63 nm, film thickness=24 μm) on a side opposite to the liquid crystal layer (first retardation layer) was subjected to a corona treatment at a discharge amount of 125 W·min/$m^2$.

Next, the film was coated with an acrylate-based polymer composition 2 having the following composition using a die coating method.

Next, in order to dry the solvent of the composition, the coating layer was cured by being heated with hot air at 70° C. for 120 seconds and being irradiated with ultraviolet rays at 300 mJ/$cm^2$, thereby forming an acrylate-based polymer layer 2.

Acrylate-Based Polymer Composition 2

ATMMT: 75.0 parts by mass

A600: 25.0 parts by mass (Bifunctional polyethylene glycol acrylate, manufactured by Shin-Nakamura Chemical Co., Ltd.)

Compound B1 represented by Formula (I): 3.0 parts by mass

Polymerization initiator (P2): 5.0 parts by mass (Omnirad 127, manufactured by IGM Resins B.V.)

Surfactant (S2) shown above: 0.5 parts by mass

Acetone: 425.6 parts by mass

Propylene glycol monomethyl ether acetate: 48.9 parts by mass

Methanol: 14.7 parts by mass

Next, as a result of evaluating the durability of the prepared optical laminate, it was confirmed that cracks in the plane of the optical laminate were reduced as compared with Comparative Example 2 as listed in Table 2.

It was considered that suppression of movement of the low-molecular-weight component of the pressure sensitive adhesive to the cycloolefin side and an increase in rigidity of the cycloolefin-based polymer were effective in suppressing cracks of the cycloolefin.

[Preparation of Optical Laminate of Example 7-1]

An optical laminate was prepared under the same conditions as in Example 7 except that the composition 1 for forming a liquid crystal layer was applied by adjusting the liquid jetting amount (decreased by 6%) using a die coating method, dried, and cured by irradiation with ultraviolet rays to form a first retardation layer, and the following acrylate-based polymer layer 2-2 (thickness of 3 μm) serving as the inorganic interlayer was directly laminated on the surface of the second retardation layer on the pressure sensitive adhesive layer side in the configuration of Example 7 to which the pressure sensitive adhesive IV had been applied.

Hereinafter, a method of forming the acrylate-based polymer layer 2-2 will be described.

A surface of a cycloolefin-based polymer film (Arton resin film, manufactured by JSR Corporation, Re=124 nm, Rth=63 nm, film thickness=24 μm) on a side opposite to the liquid crystal layer (first retardation layer) was subjected to a corona treatment at a discharge amount of 125 W·min/$m^2$.

Next, the film was coated with the acrylate-based polymer composition 2-2 having the following composition using a die coating method by adjusting the thickness of the coating film such that the film thickness after the composition was cured by the irradiation with ultraviolet rays reached 3

Next, in order to dry the solvent of the composition, the coating layer was cured by being heated with hot air at 70° C. for 120 seconds and being irradiated with ultraviolet rays at 300 mJ/$cm^2$, thereby forming an acrylate-based polymer layer 2-2. The prepared retardation layer and the prepared interlayer had a Re of 124 nm and a Rth of −21 nm in terms of the total retardation.

Acrylate-Based Polymer Composition 2-2

ATMMT: 75.0 parts by mass

A600: 25.0 parts by mass (Bifunctional polyethylene glycol acrylate, manufactured by Shin-Nakamura Chemical Co., Ltd.)

Compound B1 represented by Formula (I): 3.0 parts by mass

Polymerization initiator (P2): 5.0 parts by mass (Omnirad 127, manufactured by IGM Resins B.V.)

Surfactant (S3) shown below: 0.5 parts by mass

Acetone: 425.6 parts by mass

Propylene glycol monomethyl ether acetate: 48.9 parts by mass

Methanol: 14.7 parts by mass

Surfactant S3 (weight-average molecular weight: 11,000, the numerical values in the following formulae denote the contents (mol %) of each repeating unit with respect to all repeating units.)

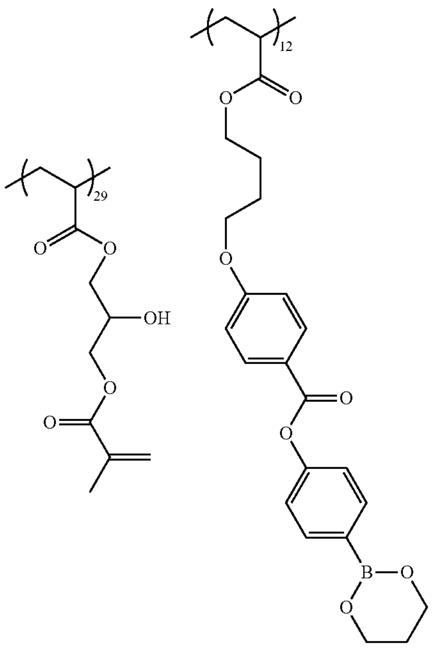

-continued

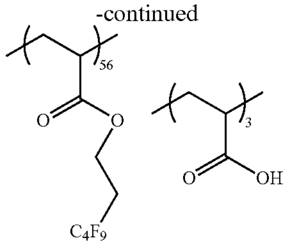

Next, as a result of evaluating the durability of the prepared optical laminate, it was confirmed that cracks in the plane of the optical laminate were reduced as compared with Comparative Example 2 as listed in Table 2.

It was considered that suppression of movement of the low-molecular-weight component of the pressure sensitive adhesive to the cycloolefin side and an increase in rigidity of the cycloolefin-based polymer were effective in suppressing cracks of the cycloolefin.

[Preparation of Optical Laminate of Example 7-2]

An optical laminate was prepared under the same conditions as in Example 7-1 except that the composition 1 for forming a liquid crystal layer was applied by adjusting the liquid jetting amount (decreased by 6%) using a die coating method, dried, and cured by irradiation with ultraviolet rays to form a first retardation layer, the second retardation layer was changed to a cycloolefin-based polymer film (Arton resin film, manufactured by JSR Corporation, Re=135 nm, Rth=68 nm, film thickness=24 μm), and the following acrylate-based polymer layer 2-2 (thickness of 2 μm) serving as the organic interlayer was directly laminated on the surface of the second retardation layer on the pressure sensitive adhesive layer side in the configuration of Example 7-1 to which the pressure sensitive adhesive IV had been applied.

Hereinafter, a method of forming the acrylate-based polymer layer 2-2 will be described.

A surface of a cycloolefin-based polymer film (Arton resin film, manufactured by JSR Corporation, Re=135 nm, Rth=68 nm, film thickness=24 μm) on a side opposite to the liquid crystal layer (first retardation layer) was subjected to a corona treatment at a discharge amount of 125 W·min/$m^2$.

Next, the film was coated with the acrylate-based polymer composition 2-2 having the above-described composition using a die coating method by adjusting the thickness of the coating film such that the film thickness after the composition was cured by the irradiation with ultraviolet rays reached 2 μm.

Next, in order to dry the solvent of the composition, the coating layer was cured by being heated with hot air at 70° C. for 120 seconds and being irradiated with ultraviolet rays at 300 mJ/$cm^2$, thereby forming an acrylate-based polymer layer 2-2. The prepared retardation layer and the prepared interlayer had a Re of 135 nm and a Rth of −12 nm in terms of the total retardation.

Next, as a result of evaluating the durability of the prepared optical laminate, it was confirmed that cracks in the plane of the optical laminate were reduced as compared with Comparative Example 2 as listed in Table 2.

It was considered that suppression of movement of the low-molecular-weight component of the pressure sensitive adhesive to the cycloolefin side and an increase in rigidity of the cycloolefin-based polymer were effective in suppressing cracks of the cycloolefin.

[Preparation of Optical Laminate of Example 7-3]

An optical laminate was prepared under the same conditions as in Example 7-2 except that the composition 1 for forming a liquid crystal layer was applied by adjusting the liquid jetting amount (decreased by 25%) using a die coating method, dried, and cured by irradiation with ultraviolet rays to form a first retardation layer, and the following acrylate-based polymer layer 2-2 (thickness of 5 μm) serving as the organic interlayer was directly laminated on the surface of the second retardation layer on the pressure sensitive adhesive layer side in the configuration of Example 7-2 to which the pressure sensitive adhesive IV had been applied.

Hereinafter, a method of forming the acrylate-based polymer layer 2-2 will be described.

A surface of a cycloolefin-based polymer film (Arton resin film, manufactured by JSR Corporation, Re=135 nm, Rth=68 nm, film thickness=24 μm) on a side opposite to the liquid crystal layer (first retardation layer) was subjected to a corona treatment at a discharge amount of 125 W·min/$m^2$.

Next, the film was coated with the acrylate-based polymer composition 2-2 having the above-described composition using a die coating method by adjusting the thickness of the coating film such that the film thickness after the composition was cured by the irradiation with ultraviolet rays reached 5

Next, in order to dry the solvent of the composition, the coating layer was cured by being heated with hot air at 70° C. for 120 seconds and being irradiated with ultraviolet rays at 300 mJ/$cm^2$, thereby forming an acrylate-based polymer layer 2-2. The prepared retardation layer and the prepared interlayer had a Re of 135 nm and a Rth of −30 nm in terms of the total retardation.

Next, as a result of evaluating the durability of the prepared optical laminate, it was confirmed that cracks in the plane of the optical laminate were reduced as compared with Comparative Example 2 as listed in Table 2.

It was considered that suppression of movement of the low-molecular-weight component of the pressure sensitive adhesive to the cycloolefin side and an increase in rigidity of the cycloolefin-based polymer were effective in suppressing cracks of the cycloolefin.

[Preparation of Optical Laminate of Example 8]

An optical laminate was prepared under the same conditions as in Example 6 except that an acrylate-based polymer layer 3 (thickness of 1 μm) serving as the organic interlayer was directly laminated on the surface of the second retardation layer on the pressure sensitive adhesive layer side in the configuration of Example 6 to which the pressure sensitive adhesive IV had been applied.

Hereinafter, a method of forming the acrylate-based polymer layer 3 will be described.

A surface of a cycloolefin-based polymer film (Arton resin film, manufactured by JSR Corporation, Re=124 nm, Rth=63 nm, film thickness=24 μm) on a side opposite to the liquid crystal layer (first retardation layer) was subjected to a corona treatment at a discharge amount of 125 W·min/$m^2$.

Next, the film was coated with an acrylate-based polymer composition 3 having the following composition using a die coating method.

Next, in order to dry the solvent of the composition, the coating layer was cured by being heated with hot air at 70° C. for 120 seconds and being irradiated with ultraviolet rays at 300 mJ/$cm^2$, thereby forming an acrylate-based polymer layer 3.

Acrylate-Based Polymer Composition 3

PET30: 100.0 parts by mass (pentaerythritol triacrylate, manufactured by Nippon Kayaku Co., Ltd.)

Compound B1 represented by Formula (I): 3.0 parts by mass

Polymerization initiator (P2): 3.0 parts by mass (Omnirad 127, manufactured by IGM Resins B.V)

Surfactant (S2) shown above: 0.5 parts by mass

Acetone: 425.6 parts by mass

Propylene glycol monomethyl ether acetate: 48.9 parts by mass

Methanol: 14.7 parts by mass

Next, as a result of evaluating the durability of the prepared optical laminate, it was confirmed that cracks in the plane of the optical laminate were reduced as compared with Comparative Example 2 as listed in Table 2.

It was considered that suppression of movement of the low-molecular-weight component of the pressure sensitive adhesive to the cycloolefin side and an increase in rigidity of the cycloolefin-based polymer were effective in suppressing cracks of the cycloolefin.

[Preparation of Optical Laminate of Example 9]

An optical laminate was prepared under the same conditions as in Example 6 except that a composition 1 for forming a liquid crystal layer (0.25 μm) serving as the organic interlayer was directly laminated on the surface of the second retardation layer on the pressure sensitive adhesive layer side in the configuration of Example 6 to which the pressure sensitive adhesive IV had been applied.

Specifically, a surface of a cycloolefin-based polymer film (Arton resin film, manufactured by JSR Corporation, Re=124 nm, Rth=63 nm, film thickness=24 μm) on a side opposite to the liquid crystal layer (first retardation layer) was subjected to a corona treatment at a discharge amount of 125 W·min/$m^2$.

Next, the film was coated with the composition 1 for forming a liquid crystal layer using a die coating method.

Next, in order to dry the solvent of the composition, the coating layer was cured by being heated with hot air at 70° C. for 120 seconds and being irradiated with ultraviolet rays at 300 mJ/$cm^2$, thereby forming a liquid crystal layer.

Next, as a result of evaluating the durability of the prepared optical laminate, it was confirmed that cracks in the plane of the optical laminate were reduced as compared with Comparative Example 2 as listed in Table 2.

It was considered that suppression of movement of the low-molecular-weight component of the pressure sensitive adhesive to the cycloolefin side and an increase in rigidity of the cycloolefin-based polymer were effective in suppressing cracks of the cycloolefin.

[Preparation of Optical Laminate of Example 10]

An optical laminate was prepared under the same conditions as in Example 6 except that a $SiO_2$ sputtering film (1 μm) was applied as the inorganic interlayer in place of the organic interlayer (acrylate-based polymer).

Next, as a result of evaluating the durability of the prepared optical laminate, it was confirmed that cracks in the plane of the optical laminate were reduced as listed in Table 3.

It was considered that suppression of movement of the organic low-molecular-weight component by the SiOx sputtering film containing the low-molecular-weight component of the pressure sensitive adhesive and an increase in rigidity of the cycloolefin-based polymer due to the sputtering film were effective in improving the crack resistance.

[Preparation of Optical Laminate of Example 11]

Figure 4:
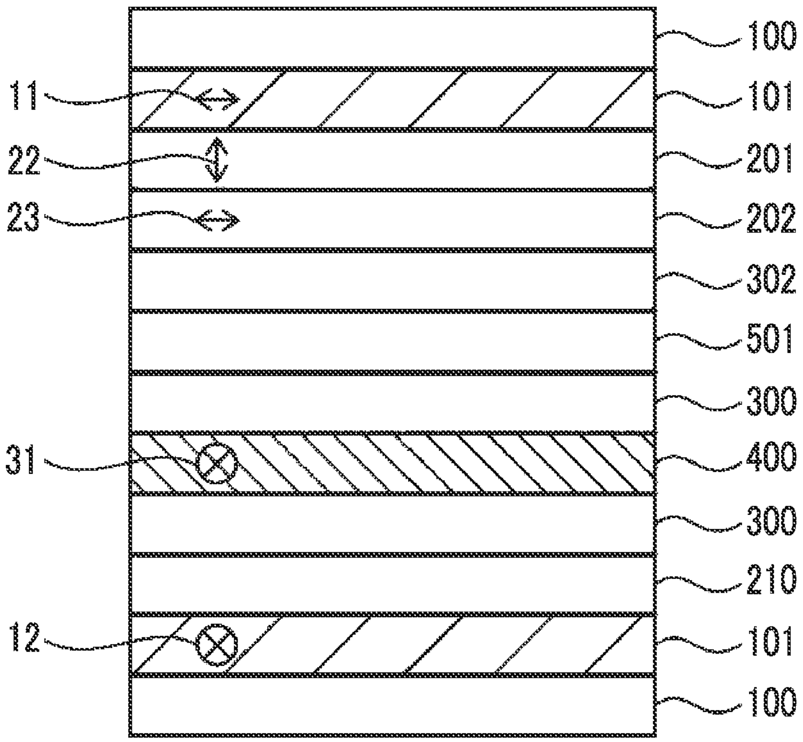
FIG. 4 is a cross-sectional view schematically illustrating still another embodiment of the image display device according to the present invention.

An optical laminate was prepared under the same conditions as in Example 6 except that a low retardation acrylic film (40 μm) was applied as the organic interlayer to the surface of the second retardation layer on the pressure sensitive adhesive layer side using the UV adhesive (film thickness of 2 μm). The layer configuration of the optical laminate is shown in FIG. 4.

Next, as a result of evaluating the durability of the prepared optical laminate, it was confirmed that cracks in the plane of the optical laminate were reduced as listed in Table 3.

The reason why the cracks were reduced was considered to be that movement of the organic low-molecular-weight component was suppressed by the acrylic film of the interlayer containing the low-molecular-weight component of the pressure sensitive adhesive and the rigidity was increased due to the UV adhesion between the cycloolefin-based polymer and the acrylic film.

[Preparation of Optical Laminate of Example 12]

An optical laminate was prepared under the same conditions as in Example 8 except that the low retardation film prepared above was applied as the organic interlayer in place of the acrylic film (40 μm).

Next, as a result of evaluating the durability of the prepared optical laminate, it was confirmed that cracks in the plane of the optical laminate were reduced as listed in Table 3.

The reason why the cracks were reduced was considered to be that movement of the organic low-molecular-weight component was suppressed by the cellulose acylate film of the interlayer containing the low-molecular-weight component of the pressure sensitive adhesive and the rigidity was increased due to the UV adhesion between the cycloolefin-based polymer and the cellulose acylate film.

[Preparation of Optical Laminate of Example 13]

An optical laminate was prepared under the same conditions as in Example 8 except that a cycloolefin film (Zeonor film with a film thickness of 40 μm) was applied as the organic interlayer to the surface of the second retardation layer on the pressure sensitive adhesive layer side using the interlayer pressure sensitive adhesive (5 μm).

Next, as a result of evaluating the durability of the prepared optical laminate, it was confirmed that cracks in the plane of the optical laminate were reduced as listed in Table 3.

The reason why the cracks were reduced was considered to be that movement of the organic low-molecular-weight component was suppressed by the cycloolefin film of the interlayer containing the low-molecular-weight component of the pressure sensitive adhesive and the rigidity was increased due to the lamination of the cycloolefin film.

[Preparation of Optical Laminate of Example 14]

Figure 6:
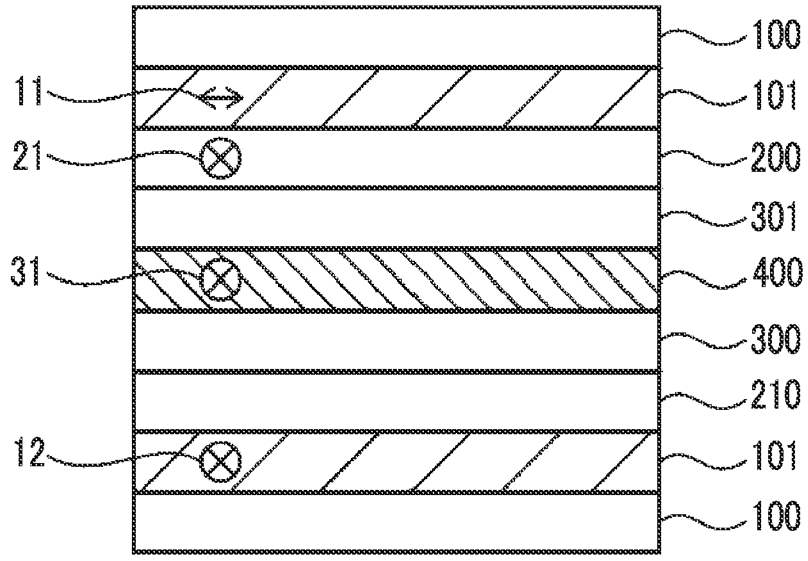
FIG. 6 is a cross-sectional view schematically illustrating even still another embodiment of the image display device according to the present invention.

An optical laminate was prepared under the same conditions as in Example 4 except that the cycloolefin-based polymer film (second retardation layer) was used along as the retardation film without using the liquid crystal layer (first retardation layer). The layer configuration of the optical laminate is shown in FIG. 6. In FIG. 6, the reference numeral 21 represents the slow axis of the cycloolefin-based polymer film (retardation layer).

Next, as a result of evaluating the durability of the prepared optical laminate, it was confirmed that cracks in the plane of the optical laminate were reduced as listed in Table 3.

[Preparation of Optical Laminate of Example 15]

Figure 5:
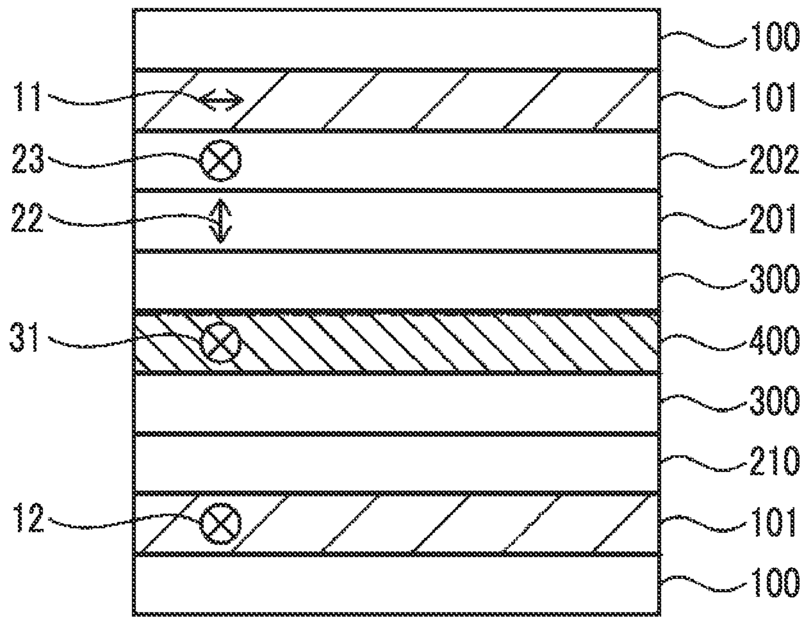
FIG. 5 is a cross-sectional view schematically illustrating even still another embodiment of the image display device according to the present invention.

An optical laminate was prepared under the same conditions as in Comparative Example 2 except that a configuration in which the first retardation layer and the second retardation layer were reversed was applied. The layer configuration of the optical laminate is shown in FIG. 5.

Next, as a result of evaluating the durability of the prepared optical laminate, it was confirmed that cracks in the plane of the optical laminate were reduced as listed in Table 3.

The reason why the cracks were reduced was considered to be that movement of the organic low-molecular-weight component of the pressure sensitive adhesive was suppressed because the liquid crystal layer (acrylate polymerized polymer) also served as the organic interlayer due to the deposition of the liquid crystal layer on the pressure sensitive adhesive side.

[Evaluation of Durability]

The durability of each of the obtained optical laminates was evaluated.

Specifically, a durability test was performed by cutting each optical laminate into a size of 300 mm×100 mm square, bonding the pressure sensitive adhesive layer side to the glass substrate, and allowing the laminate to stand in a dry constant-temperature tank at 115° C. for 100 hours, the occurrence of cracks was observed until the laminate was allowed to stand in a normal temperature and normal humidity environment for one week after the durability test, and the observation results were scored as follows.

A: No cracks were observed in N=2.

B: Cracks were observed to occur at approximately 1 to 3 sites in any of N=2. (including an experimental error level)

C: Small cracks with a size of approximately 2 mm occurred in less than 10 sites. (at a level that cracks were difficult to visually recognize)

D: Cracks with a size of approximately 5 mm to 10 mm occurred in multiple sites (several tens or more sites) in the plane.

(multiple cracks that were clearly visually recognizable occurred)

The results are listed in Tables 1 to 3. Practically, from the viewpoint of the visibility, C indicates that there is a clear improvement effect, and A and B are preferable, and A is more preferable for practical use.

With respect to the prepared optical laminates, the results of Re (550) and Rth (550) of the entire retardation layer, Re (550) and Rth (550) of the entirety of the retardation layer and the interlayer, the content of the organic low-molecular-weight component with a molecular weight of 500 or less in the pressure sensitive adhesive layer, and the content of the organic low-molecular-weight component with a molecular weight of 32 to 200 in the pressure sensitive adhesive layer before and after the durability test are listed in Tables 1 to 3.

TABLE 1

| | Comparative Example 1 | Example 1 | Example 2 |
|---|---|---|---|
| Polarizer layer | PVA | PVA | PVA |
| First retardation layer | Rod-like liquid crystal | Rod-like liquid crystal | Rod-like liquid crystal |
| Second retardation layer | COP | COP | COP |
| Re/Rth (nm) of entire retardation layer | 124/−28 | 124/−28 | 124/−28 |
| Adhesive layer | — | — | — |
| Interlayer | — | — | — |
| Pressure sensitive adhesive | III | I | II |
| Organic low-molecular-weight component (molecular weight of 500 or less) | 5.5% by mass | 2.6% by mass | 0.6% by mass |
| Durability | D | C | A |

TABLE 2

| | Comparative Example 2 | Example 3 | Example 4 | Example 5 | Example 6 | Example 7 | Example 7-1 | Example 7-2 | Example 7-3 |
|---|---|---|---|---|---|---|---|---|---|
| Polarizer layer | PVA | PVA | PVA | PVA | PVA | PVA | PVA | PVA | PVA |
| First retardation layer | Rod-like liquid crystal | Rod-like liquid crystal | Rod-like liquid crystal | Rod-like liquid crystal | Rod-like liquid crystal | Rod-like liquid crystal | Rod-like liquid crystal | Rod-like liquid crystal | Rod-like liquid crystal |
| Second retardation layer | COP | COP | COP | COP | COP | COP | COP | COP | COP |
| Re/Rth (nm) of entire retardation layer | 124/−28 | 124/−28 | 124/−28 | 124/−28 | 124/−28 | 124/−28 | 124/−22 | 135/−13 | 135/−31 |
| Adhesive or pressure sensitive adhesive | None | None | None | None | None (direct) | None (direct) | None (direct) | None (direct) | None (direct) |
| Interlayer | None | None | None | None | Acrylate-based polymer composition 1 | Acrylate-based polymer composition 2 | Acrylate-based polymer composition 2-2 | Acrylate-based polymer composition 2-2 | Acrylate-based polymer composition 2-2 |
| Re/Rth (nm) of entirety of retardation layer and interlayer | 124/−28 | 124/−28 | 124/−28 | 124/−28 | 124/−27 | 124/−27 | 124/−21 | 135/−12 | 135/−30 |
| Pressure sensitive adhesive | IV | V | VI | VII | IV | IV | IV | IV | IV |
| Organic low-molecular-weight component (molecular weight of 32 to 200) Initial value | 1,500 ppm | 1,500 ppm | 500 ppm | 50 ppm | 1,500 ppm | 1,500 ppm | 1,500 ppm | 1,500 ppm | 1,500 ppm |
| Organic low-molecular-weight component (molecular weight of 32 to 200) After 100 hours at 115° C. | 1,500 ppm | 500 ppm | 50 ppm | Lower than or equal to detection limit | 1,500 ppm | 1,500 ppm | 1,500 ppm | 1,500 ppm | 1,500 ppm |
| Durability | D | B | A | A | A | A | A | A | A |

TABLE 3

| | Example 8 | Example 9 | Example 10 | Example 11 | Example 12 | Example 13 | Example 14 | Example 15 |
|---|---|---|---|---|---|---|---|---|
| Polarizer layer | PVA | PVA | PVA | PVA | PVA | PVA | PVA | PVA |
| First retardation layer | Rod-like liquid crystal | Rod-like liquid crystal | Rod-like liquid crystal | Rod-like liquid crystal | Rod-like liquid crystal | Rod-like liquid crystal | None | COP |
| Second retardation layer | COP | COP | COP | COP | COP | COP | COP | None |
| Re/Rth (nm) of entire retardation layer | 124/−28 | 124/−10 | 124/−28 | 124/−28 | 124/−28 | 124/−28 | 270/0 | 125/63 |
| Adhesive or pressure sensitive adhesive | None (direct) | None (direct) | None (direct) | UV adhesive | UV adhesive | Interlayer pressure sensitive adhesive | None | None |
| Interlayer | Acrylate-based polymer composition 3 | Rod-like liquid crystal | $SiO_2$ sputtering film | Acrylic film | Low Re film | COP | None | Rod-like liquid crystal |
| Re/Rth (nm) of entirety of retardation layer and interlayer | 124/−27 | 124/−40 | 124/−28 | 123/−29 | 123/−33 | 125/−23 | 270/0 | 124/−28 |
| Pressure sensitive adhesive | IV | IV | IV | IV | IV | IV | VI | IV |
| Organic low-molecular-weight component (molecular weight of 32 to 200) Initial value | 1,500 ppm | 1,500 ppm | 1,500 ppm | 1,500 ppm | 1,500 ppm | 1,500 ppm | 500 ppm | 1,500 ppm |
| Organic low-molecular-weight component (molecular weight of 32 to 200) After 100 hours at 115° C. | 1,500 ppm | 1,500 ppm | 1,500 ppm | 1,500 ppm | 1,500 ppm | 1,500 ppm | 50 ppm | 1,500 ppm |
| Durability | A | A | A | B | B | A | A | A |

As listed in Tables 1 to 3, it was found that in a case where the optical laminate satisfies Condition I or Condition II and Condition III, the resistance is greatly improved.

In particular, based on the comparison between the examples, it was newly found that the amount of the (meth)acrylic acid ester-based monomer having a cyclic structure serving as the organic low-molecular-weight component needs to be reduced, the amount of the low-molecular-weight component such as the AS agent needs to be reduced as much as possible, and the storage elastic modulus of the pressure sensitive adhesive layer needs to be high from the viewpoint of the rigidity.

EXPLANATION OF REFERENCES

11: first polarizer absorption axis
12: second polarizer absorption axis
21: slow axis of cycloolefin-based polymer film (retardation layer)
22: slow axis of liquid crystal layer (first retardation layer)
23: slow axis of cycloolefin-based polymer film (second retardation layer)
31: liquid crystal director direction (liquid crystal alignment direction) of IPS liquid crystal cell
100: protective film
101: polarizer
200: cycloolefin-based polymer film (retardation layer)
201: liquid crystal layer (first retardation layer)
202: cycloolefin-based polymer film (second retardation layer)
210: low retardation film (isotropic retardation film)
300: pressure sensitive adhesive layer
301: low-molecular-weight reduction pressure sensitive adhesive layer
302: adhesive or pressure sensitive adhesive
400: IPS liquid crystal cell
500: interlayer (direct lamination)
501: interlayer (film)

What is claimed is:

1. An optical laminate comprising in the following order:
a polarizer;
a retardation layer including a cycloolefin-based polymer film disposed on a polarizer via an adhesive layer; and
a pressure sensitive adhesive layer disposed directly on a liquid crystal cell,
wherein the polarizer includes a protective layer disposed on a side of the polarizer opposite the retardation layer via an adhesive layer, and
Condition I and Condition III are satisfied,
Condition I: the retardation layer, an interlayer and the pressure sensitive adhesive layer are in direct contact in this order, wherein the interlayer is an organic interlayer or an inorganic interlayer, a thickness of the organic interlayer is greater than 0.2 μm and 10 μm or less, and a thickness of the inorganic interlayer is in a range of 0.05 to 5 μm,
Condition III: an in-plane retardation Re (550) and a thickness direction retardation Rth (550) of an entire retardation layer at a wavelength of 550 nm respectively satisfy Expressions (1) and (2), $$0\ \text{nm} \le Re(550) \le 350\ \text{nm} \quad \text{Expression (1):}$$

$$-200\ \text{nm} \le Rth(550) \le 200\ \text{nm}. \quad \text{Expression (2):}$$

2. The optical laminate according to claim 1,
wherein the organic interlayer is a layer other than a liquid crystal layer.

3. The optical laminate according to claim 1,
wherein the retardation layer has a liquid crystal layer on a side of the polarizer of the cycloolefin-based polymer film.

4. The optical laminate according to claim 2, wherein the retardation layer has a liquid crystal layer on a side of the polarizer of the cycloolefin-based polymer film.

5. The optical laminate according to claim 1, wherein Condition I is satisfied, and an in-plane retardation Re1 (550) and a thickness direction retardation Rth1 (550) of an entirety of the retardation layer and the interlayer at a wavelength of 550 nm respectively satisfy Expression (1) and Expression (2), $$0\ nm \leq Re1(550) \leq 350\ nm \qquad \text{Expression (1):}$$

$$-200\ nm \leq Rth1(550) \leq 200\ nm. \qquad \text{Expression (2):}$$

6. The optical lamination according to claim 1, wherein in a measurement performed on the pressure sensitive adhesive layer using a headspace type gas chromatograph mass spectrometer, the content of the organic low-molecular-weight component having a molecular weight of 32 to 200 is 1,000 ppm or less.

7. The optical lamination according to claim 1, wherein in a case where the durability test is performed at 115° C. for 100 hours in the state in which the optical laminate is adhered to the glass substrate via the pressure sensitive adhesive layer, in a measurement performed on the pressure sensitive adhesive layer after the durability test using a headspace type gas chromatograph mass spectrometer, the content of the organic low-molecular-weight component having a molecular weight of 32 to 200 is 500 ppm or less.

8. The optical laminate according to claim 1, wherein a film thickness of the pressure sensitive adhesive layer is 5 μm or greater and 50 μm or less, and a storage elastic modulus of the pressure sensitive adhesive layer is 0.18 MPa or greater and 5 MPa or less.

9. The optical laminate according to claim 1, wherein a residual amount of an acrylic acid ester-based or methacrylic acid ester-based monomer having a cyclic structure in the pressure sensitive adhesive layer is 100 ppm or less.

10. An image display device comprising: the optical laminate according to claim 1.

11. The optical laminate according to claim 1, wherein the organic interlayer is in a range of 0.5 to 5 μm.

12. The optical laminate according to claim 1, wherein the organic interlayer is a cured layer of a composition containing a polyfunctional monomer.

13. The optical laminate according to claim 12, wherein the composition contains a compound represented by Formula (I)

$$(Z)_n\text{-}L^{100}\text{-}(Q)_m; \qquad \text{Formulas (I)}$$

where, in Formula (I), Z represents a substituent containing a polymerizable group, n represents an integer of 0 to 4, and in a case where n represents an integer of 2 to 4, two or more of Z's may be the same as or different from each other, Q represents a substituent having at least one boron atom, m represents 1 or 2, and in a case where m represents 2, two Q's may be the same as or different from each other, $L^{100}$ represents an (n+m)-valent linking group and in a case where n represents 0 and m represents 1, $L^{100}$ represents a hydrogen atom, a substituted or unsubstituted alkyl group, a substituted or unsubstituted alkenyl group, a substituted or unsubstituted alkynyl group, a substituted or unsubstituted aryl group, or a substituted or unsubstituted heteroaryl group.

14. The optical laminate according to claim 13, wherein Q represents a substituent represented by General Formula (VI),

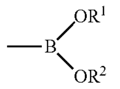

where, in General Formula (VI), $R^1$ and $R^2$ each independently represent a hydrogen atom, a substituted or unsubstituted aliphatic hydrocarbon group, a substituted or unsubstituted aryl group, or a substituted or unsubstituted heteroaryl group.

15. The optical laminate according to claim 12, wherein the composition contains a polymerization initiator.

16. The optical laminate according to claim 1, wherein the organic interlayer is a cured layer of a composition containing a liquid crystal compound.

* * * * *